United States Patent
Ramanath et al.

(10) Patent No.: US 8,524,362 B2
(45) Date of Patent: Sep. 3, 2013

(54) DOPED PNICTOGEN CHALCOGENIDE NANOPLATES, METHODS OF MAKING, AND ASSEMBLIES AND FILMS THEREOF

(75) Inventors: Ganpati Ramanath, Schenectady, NY (US); Theodorian Borca-Tasciuc, Troy, NY (US); Rutvik Mehta, Troy, NY (US)

(73) Assignee: Rensselaer Polytechnic Institute, Troy, NY (US)

( * ) Notice: Subject to any disclaimer, the term of this patent is extended or adjusted under 35 U.S.C. 154(b) by 328 days.

(21) Appl. No.: 12/856,264

(22) Filed: Aug. 13, 2010

(65) Prior Publication Data

US 2012/0111385 A1   May 10, 2012

Related U.S. Application Data

(60) Provisional application No. 61/274,275, filed on Aug. 14, 2009.

(51) Int. Cl.
  *H01L 35/28* (2006.01)
  *B01J 19/12* (2006.01)
  *C04B 35/64* (2006.01)
  *B32B 5/16* (2006.01)
  *C09K 5/00* (2006.01)

(52) U.S. Cl.
  USPC ....... 428/402; 136/200; 136/238; 204/157.43

(58) Field of Classification Search
  None
  See application file for complete search history.

(56) References Cited

U.S. PATENT DOCUMENTS

2008/0036101 A1* 2/2008 Xiao et al. .................... 257/930

OTHER PUBLICATIONS

Fan et al. (Bi2Te3 hexagonal nanoplates and thermoelectric properties of n-type Bi2Te3 nanocomposites, J. Phys. D: Appl. Phys. 40 (2007) 5975-5979).*
Purkayastha et al. (Molecularly Protected Bismuth Telluride Nanoparticles: Microemulsion Synthesis and Thermoelectric Transport Properties, Adv. Mater. 2006, 18, 2958-2963).*
Li et al. (Effects of Annealing and Doping on Nanostructured Bismuth Telluride Thick Films, Chem. Mater. 2008, 20, 4403-4410).*
Shi et al. (Hydrothermal Synthesis and Thermoelectric Transport Properties of Impurity-Free Antimony Telluride Hexagonal Nanoplates, Adv. Mater., 2008, 20, 1892-1897).*
Lu et al. (Bismuth Telluride Hexagonal Nanoplatelets and Their Two-Step Epitaxial Growth), J. Am. Chem. Soc. 2005, 127, 10112-10116).*
Harman et al., "Quantum Dot Superlattice Thermoelectric Materials and Devices," Science, Sep. 27, 2002, pp. 2229-2232, vol. 297.
Heremans et al., "Enhancement of Thermoelectric Efficiency in PbTe by Distorion of the Electronic Density of States," Science, Jul. 28, 2008, pp. 554-557, vol. 321.

(Continued)

*Primary Examiner* — Mark Ruthkosky
*Assistant Examiner* — Alexandre Ferre
(74) *Attorney, Agent, or Firm* — Saliwanchik, Lloyd & Eisenschenk, P.A.

(57) ABSTRACT

Embodiments of the invention are directed to doped pnictogen chalcogenide nanoplates, where each nanoplate comprises a rhombohedral crystal of $Bi_2Te_3$, $Bi_2Se_3$, or $Sb_2Te_3$ that is sulfur doped. Another embodiment of the invention is directed to a microwave activated method of preparation of the doped pnictogen chalcogenide nanoplates. Other embodiments of the invention are directed to bulk assemblies or fused films of the doped pnictogen chalcogenide nanoplates and their preparation from the doped pnictogen chalcogenide nanoplates such that the bulk assembly or fused film can be employed in a thermoelectric device.

26 Claims, 20 Drawing Sheets

(56) References Cited

OTHER PUBLICATIONS

Hicks et al., "Effect of Quantum-Well Structures on the Thermoelectric Figure of Merit," Physical Review B. May 15, 1993, 12 737-12 731, vol. 47, No. 19.

Horak et al., "Inversion of Conductivitiy Type in Bi2Te3-xSx Crystals," Solid State Communications, 1985, pp. 1031-1034, vol. 55, No. 11.

Hyde et al., "Electronic Properties of Bi2Se3 Crystals," J. Phys. Chem. Solids, 1974, pp. 1719-1728, vol. 35.

Kanatzidis, "Nanostructured Thermoelectrics: The New Paradigm?", Chemistry of Materials Review, 2009, pp. 648-659, vol. 22.

Minnich et al., "Bulk Nanostructured Thermoelectric Materials: Current Research and Future Prospects," Energy & Environmental Science, 2009, pp. 466-479, vol. 2.

Peranio et al., "Structural and Thermoelectric Properties of Epitaxially Grown Bi2Te3 Thin Films and Superlattices," Journal of Applied Physics, 2006, No. 100.

Peranio et al., "Structural Modulations in Bi2Te3," Journal of Applied Physics, 2008, No. 103.

Poudel et al., "High-Thermoelectric Performance of Nanostructured Bismuth Antimony Telluride Bulk Alloys," Science, May 2, 2008, pp. 634-638, vol. 320.

Purkayastha et al., "Molecularly Protected Bismuth Telluride Nanoparticles: Microemulsion Synthesis and Thermoelectric Transport Properties," Advanced Materials, 2006, pp. 2958-2963, No. 18.

Purkayastha et al., "Low-Temperature, Template-Free Synthesis Synthesis of Single-Crystal Bismuth Telluride Nanorods," Advanced Materials, 2006, pp. 496-500, No. 18.

H. Sherrer and S. Sherrer, "Chapter 19: Bismuth Telluride, Antimony Telluride, and Their Solid Solutions," Section D Thermoelectric Materials, 1995, CRC Press LLC.

Snyder et al., "Complex Thermoelectric Materials," Nature Materials, Feb. 2008, pp. 105-114, vol. 7.

Venkatasubramanian et al., "Thin-Film Thermoelectric Devices with High Room-Temperature Figures of Merit," Nature, Oct. 11, 2001, pp. 597-602, vol. 413.

Christian et al., "A General Route to Nanostructured Bismuth Chalcogenides," Journal of Materials Chemistry, 2005, pp. 3021-3025, vol. 15.

* cited by examiner

DOPED PNICTOGEN CHALCOGENIDE NANOPLATES, METHODS OF MAKING, AND ASSEMBLIES AND FILMS THEREOF

CROSS-REFERENCE TO RELATED APPLICATION

This application claims the benefit of U.S. Provisional Patent Application Ser. No. 61/274,275, filed on Aug. 14, 2009, which is hereby incorporated by reference in its entirety (including all tables, figures, and other associated data).

The subject invention was made with government funds under Contract No. HR0011-07-3-0002 awarded by DARPA. The U.S. Government has rights in this invention.

BACKGROUND OF THE INVENTION

Achieving high figure of merit (ZT) thermoelectric materials is a challenge because it requires a combination of low thermal conductivity κ and high thermoelectric power factor ($\alpha^2\sigma$), i.e., high electrical conductivity σ and Seebeck coefficient α, and these properties are often contraindicated. One approach to achieving high ZT thermoelectric materials is through nanostructuring, which has been shown to factorially increase ZT due to size-scattering induced decrease of thermal conductivity κ, yet possesses a high electrical conductivity σ and Seebeck coefficient α due to quantum effects.

Nanostructuring bismuth- and antimony-based chalcogenides and their alloys are of great interest because these materials exhibit the highest room temperature ZT of ~1 in bulk. Restricting the characteristic dimensions of these bismuth and antimony based chalcogenides to below 10 nm offers the potential to obtaining further ZT increases. However, except for a surfactant-directed synthesis that achieves 2.5 to 10 nm diameter single crystal bismuth telluride particles, few techniques exist for synthesizing pnictogen chalcogenide nanocrystals with characteristic dimensions <10 nm. Bismuth and antimony chalcogenide nanostructures synthesized by solvothermal routes or by electrodeposition into inorganic templates often produce polycrystalline or polydisperse products instead of single crystals with controllable sizes and shapes, and involve long times, ranging from a few hours to a couple of days, for formation.

Thus, there continues to be a need in the art for materials and methods for producing high quality single crystal bismuth- and antimony-based chalcogenide nanoparticles.

BRIEF SUMMARY OF THE INVENTION

Embodiments of the invention provide doped pnictogen chalcogenide nanoplates, assemblies, and films, and methods for making the same.

In accordance with embodiments of the invention, a rapid microwave-stimulated synthesis of single-crystal hexagonal nanoplates of sulfur-doped bismuth telluride, bismuth selenide and antimony telluride and the resulting nanoplates are provided. The nanoplates are less than about 100 nm in one dimension, for example 5 to 20 nm in thickness, and can have controllable nanoplate lateral dimensions. For example, the lateral dimension can be formed from nanometer to micrometer ranges. The nanoplates can have an aspect ratio (thickness:length) in the range of 2 to 5 or more. Advantageously, single-phase thin films and/or bulk pellets comprised of these nanoplates exhibit κ values that are up to 50% lower than known alloy nano- and micro-particles, and the nanoplates display 5 to 10% higher thermoelectric power factor than known alloy nano- and micro-particles.

The subject doped pnictogen calcogenide nanoplates display a remarkable combination of low κ without alloying while preserving high intrinsic α and σ of bulk counterparts.

According to certain embodiments, a method is provided that includes performing microwave irradiation to activate the reaction between ligated $Te^{2-}$ or $Se^{2-}$ ions and thioglycolic acid (TGA) complexes of $Bi^{3+}$ or $Sb^{3+}$. The TGA utilized in certain embodiments of the invention facilitates crystal-shape sculpting, curtails surface oxidation, and provides sulfur doping of resulting pnictogen metal calcogenide nanoplates, which produces an enhanced Seebeck coefficient and high electrical conductivity of a pnictogen chalcogenide and can reverse the majority carrier type for the bismuth chalcogenides.

In another embodiment of the invention, sulfur-doped pnictogen chalcogenide nanoplates are provided and comprise the building blocks for dense close-packed/stacked thin films and bulk assemblies with tailored properties for thermoelectric devices.

DETAILED DESCRIPTION OF THE INVENTION

Figure 1:
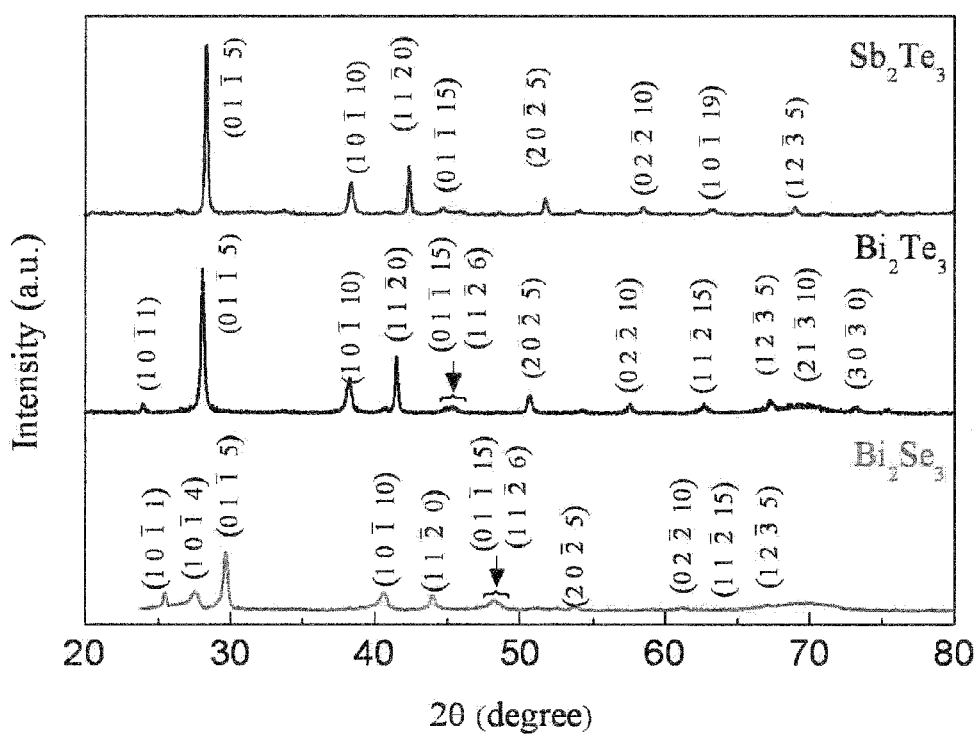
FIG. 1 shows X-ray diffractograms from $Sb_2Te_3$ (top), $Bi_2Te_3$ (middle), and $Bi_2Se_3$ (bottom) nanoplates of an embodiment of the invention.

Embodiments of the invention provide doped pnictogen chalcogenide nanoplates, assemblies, and films, and methods for making the same.

In accordance with certain embodiments of the invention, single-component bulk assemblies of doped pnictogen chalcogenides nanoplates are achieved having a 25% to 250% enhancement in the room temperature thermoelectric figure of merit (ZT), relative to their individual bulk (not nanostructured) counterparts.

In accordance with certain embodiments of the invention, doped pnictogen chalcogenide nanoplates are provided comprising a rhombohedral crystal of $Bi_2Te_3$, $Bi_2Se_3$, or $Sb_2Te_3$ that is sulfur doped. According to an embodiment, a majority of multiplicity of the doped pnictogen chalcogenide nanoplates are hexagonal in shape. Pnictogen chalcogenide nanoplates of $Bi_2Te_3$, $Bi_2Se_3$ and $Sb_2Te_3$ of embodiments of the invention yield bulk assemblies of either n- or p-type nanostructured material that has room temperature ZT of 1 to about 1.5 and even up to 2 to 3, and possibly higher.

According to an embodiment of the invention, the bulk doped pnictogen chalcogenides assemblies are formed by compaction and sintering of the subject nanoplates. In another embodiment of the invention doped pnictogen chalcogenides nanoplates are synthesized by a rapid, scalable microwave promoted synthesis. The resulting pnictogen chalcogenides nanoplates are sulfur doped at levels of less than 10 atom percent, for example, less than about 0.3 atom percent, less than 1 atom percent, less than 2 atom percent, less than 5 atom percent, or less than 10 atom percent. The sulfur doping can be carried out by the use of a mercaptan terminated ligand, such as thioglycolic acid (TGA), mercaptopropionic acid, or other mercaptan terminated acids (mercaptonic acids), as a nanoplate-sculpting and surface-passivation agent in the novel nanoplate synthesis. Other sulfur-bearing molecules that can be used to carry out the sulfur doping include, but are not limited to, thiols (e.g., octadecanethiol), dithiols (e.g., propanedithiol and polyethylene dithiol), thiones (e.g., L-glutathione), and thioglycolates. The sulfur doping enhances the electrical conductivity and Seebeck coefficient relative to undoped pnictogen chalcogenides. The sulfur doping can reverse the majority carrier type in the assemblies of pnictogen chalcogenides nanoplates. Thermal conductivity values as low as 0.5-1.4 W/mK are achieved in the doped pnictogen chalcogenides nanoplate assemblies without alloying.

In accordance with the subject disclosure, alloying can be understood to occur when the sulfur reaches over 10 atom percent. The doping can be understood to occur at sulfur content less than 1% and may occur between 1%-10% so long as single phase is maintained in the structure. The particular structural changes witnessed depend on the material system. Although not described herein, the subject microwave methods can also be used to alloy the pnictogen chalcogenides with sulfur.

The nanoplate assemblies of embodiments of the invention display nanoscale grains and nanoscale structural modulations within each grain. The superior high figure of merit (ZT) thermoelectric materials allow the subject nanoplate assemblies to be used for thermoelectric devices according to embodiments of the invention where the devices act as solid-state refrigeration or electrical power generation from heat.

Embodiments of the invention provide sulfur-doped pnictogen chalcogenide nanoplates that can comprise the building blocks for dense close-packed/stacked thin films and bulk assemblies with tailored properties for thermoelectric devices. By creating dense thin films, the thermoelectric properties of the thin films can approach and exceed those of bulk. For example, decreased thermal conductivity in thin films provides higher ZT. In certain embodiments, the thin films can be produced by inkjet printing, spray/drop casting, dip-coating, or other deposition techniques of the subject sulfur-doped pnictogen chalcogenide nanoplates.

According to one embodiment of the invention, a TGA-ligated pnictogen is mixed with a phosphine ligated chalcogen in a high boiling alkanediol or an equivalent solvent, for example polyethylene glycol, to form the reaction mixture for the doped pnictogen chalcogenides nanoplates. The ligated pnictogen can result from bismuth and antimony acetates, nitrates, chlorides, and neodecanoate. The ultimate source of the chalcogenide can be tellurium or selenium powder, tellurium or selenium acids or oxides. Sulfur doping can result from the inclusion of thioglycolic acid, mercaptopropionic acid, mercaptoacetic acid, other mercaptan terminated acids, or other sulfur bearing molecules such as thiols, dithiols, thiones, or thioglycolates. For example, a tri-n-octylphosphine (TOP)-ligated tellurium or selenium can be mixed with TGA-ligated bismuth or antimony ions in 1-5 pentanediol. The phosphine ligated chalcogens serve as microwave susceptor such that heating occurs upon microwave irradiation of the reaction mixture. The solvent can be an alkane diol or polyol, or similar reagents that can be used advantageously. The high-boiling alkane diol, or an equivalent solvent, facilitates rapid liquid-phase synthesis at high temperatures. The microwave source can have a range of power, where the rate of the reaction depends on the rate at which microwave radiation is provided to the mixture. Reaction times of less than three minutes are easily achieved at relatively low doses of microwaves.

The successful preparation of the reaction mixture according to certain embodiments requires control of the microwave dose (J) which equals the microwave power (Watts) times the period of time (seconds). For example, a 300 W variable-power automated single-mode microwave oven allows temperature of about 180° C. to about 225° C. with reaction times of about 120 to 150 seconds to achieve the desired doped pnictogen chalcogenide nanoplates. Temperatures of 30° C. to 400° C. can be used with reaction times in excess of 300 seconds for low temperatures and less than 60 seconds for high temperatures, or even reactions times anywhere between 60 seconds and 300 seconds over the range of temperatures. Temperatures and times can be optimized according to microwave power. In addition, as the temperature is increased, the reaction time can be decreased to achieve a same desired doped pnictogen chalcogenide nanoplate. However, the maximum temperature is limited by the material. For the doped pnictogen chalcogenides described in examples herein, the maximum temperature less than the melting point of the pnictogen chalcogenide, for example, less than about 585° C. for $Bi_2Te_3$, less than about 706° C. for $Bi_2Se_3$, and less than about 580° C. for $Sb_2Te_3$.

The microwave dose (J) per volume or mass being irradiated can be selected as necessary to form the desired doped pnictogen chalcogenide nanoplate.

Although the exemplary embodiments of the invention described in detail herein are directed to batch processing, the method is not so limited and continuous processing is readily carried out by control of fluid flows, irradiation chamber sizes and irradiation intensity, as can be appreciated by one skilled in the art. The use of a 1250 W multi-mode domestic oven allows formation of the doped pnictogen chalcogenides nanoplates as a black precipitate in about 10 to 15 seconds with complete reaction in less than about 30 to 60 seconds where temperatures between 225° C. and 270° C., the boiling point of the employed pentanediol solvent, are observed.

The subject nanoplates and assemblies can be surface capped or ligated with thiol surfactants. This can occur during the doping process due to the surface thioligation by, for example, TGA. The surface capping suppresses oxidation and protects the surface of the subject nanoplates. Advantageously, the capping permits ease of handling and storage.

Figure 2:
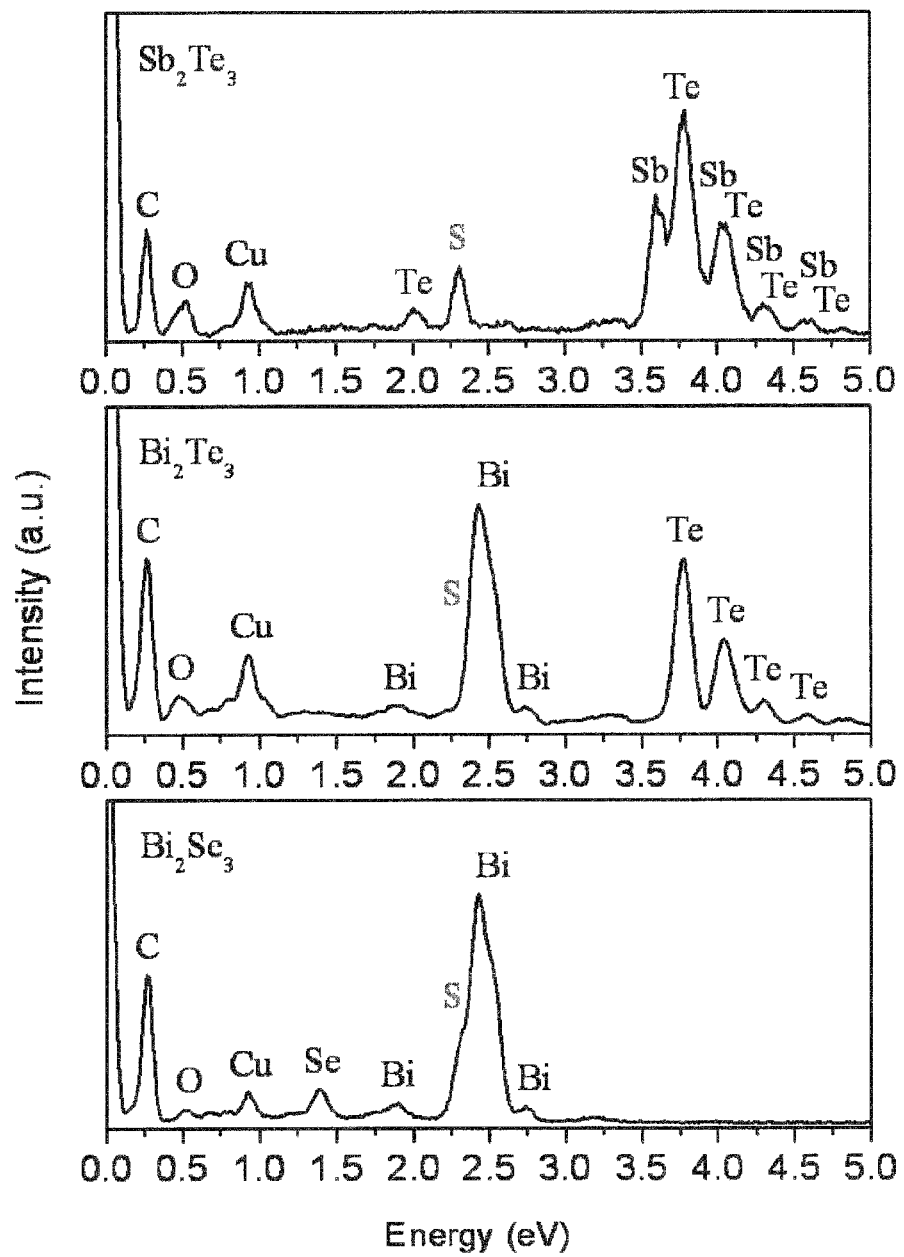
FIG. 2 shows energy dispersive X-ray spectra from $Sb_2Te_3$ (top), $Bi_2Te_3$ (middle), and $Bi_2Se_3$ (bottom) nanoplates of an embodiment of the invention.
Figure 3:
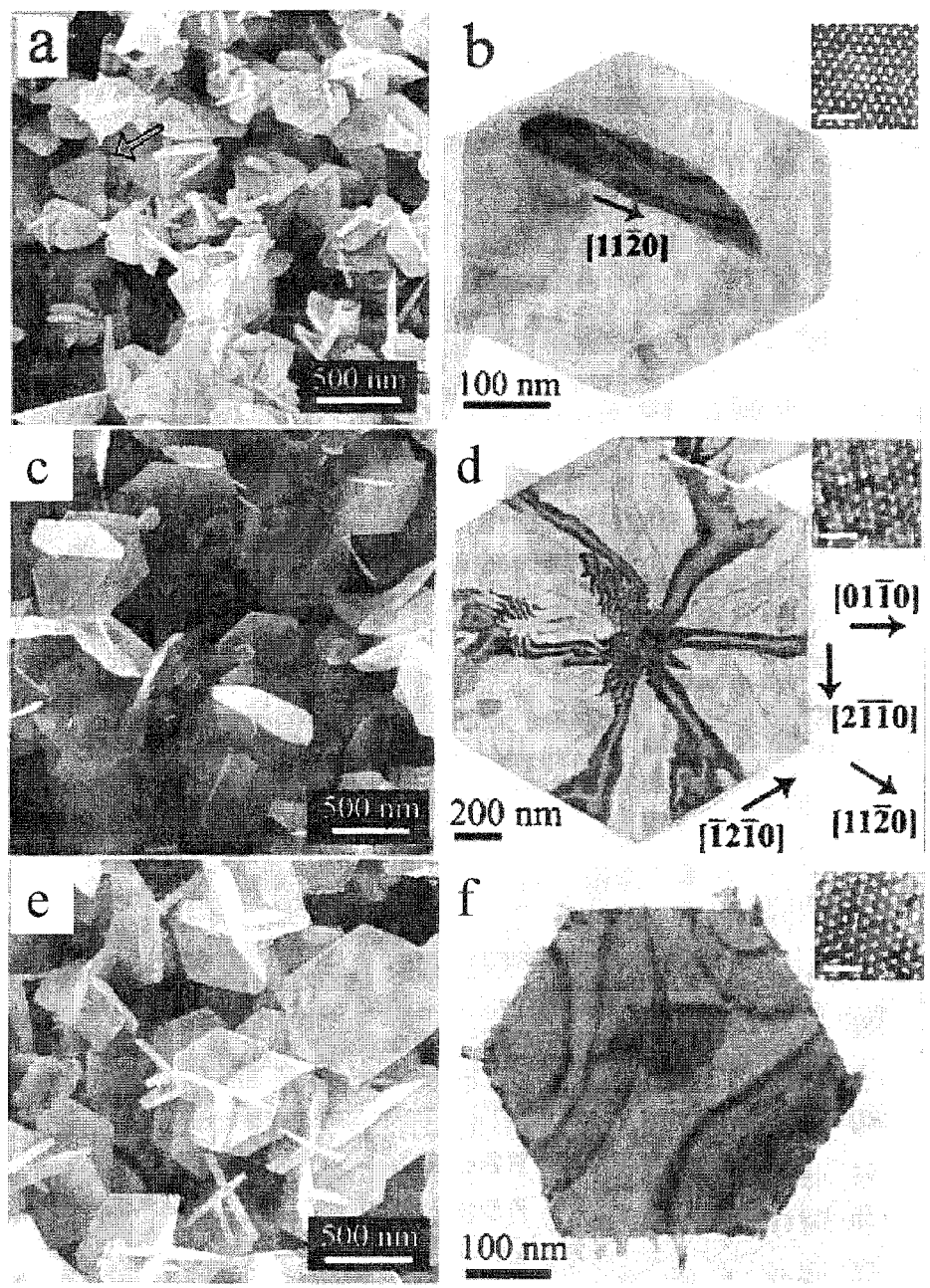
FIG. 3 show SEM images from a sample of a) $Bi_2Te_3$, c) $Bi_2Se_3$, and e) $Sb_2Te_3$ nanoplates according to an embodiment of the invention, where the arrow in a) indicates a nanoplate with a truncated triangle shape; and bright field TEM images of b) $Bi_2Te_3$, d) $Bi_2Se_3$, and f) $Sb_2Te_3$, where the arrow in b) indicates the direction of the parent crystal along which a branch grows, and the inserts in b), d) and 0 are [0001] zone lattice images.
Figure 4:
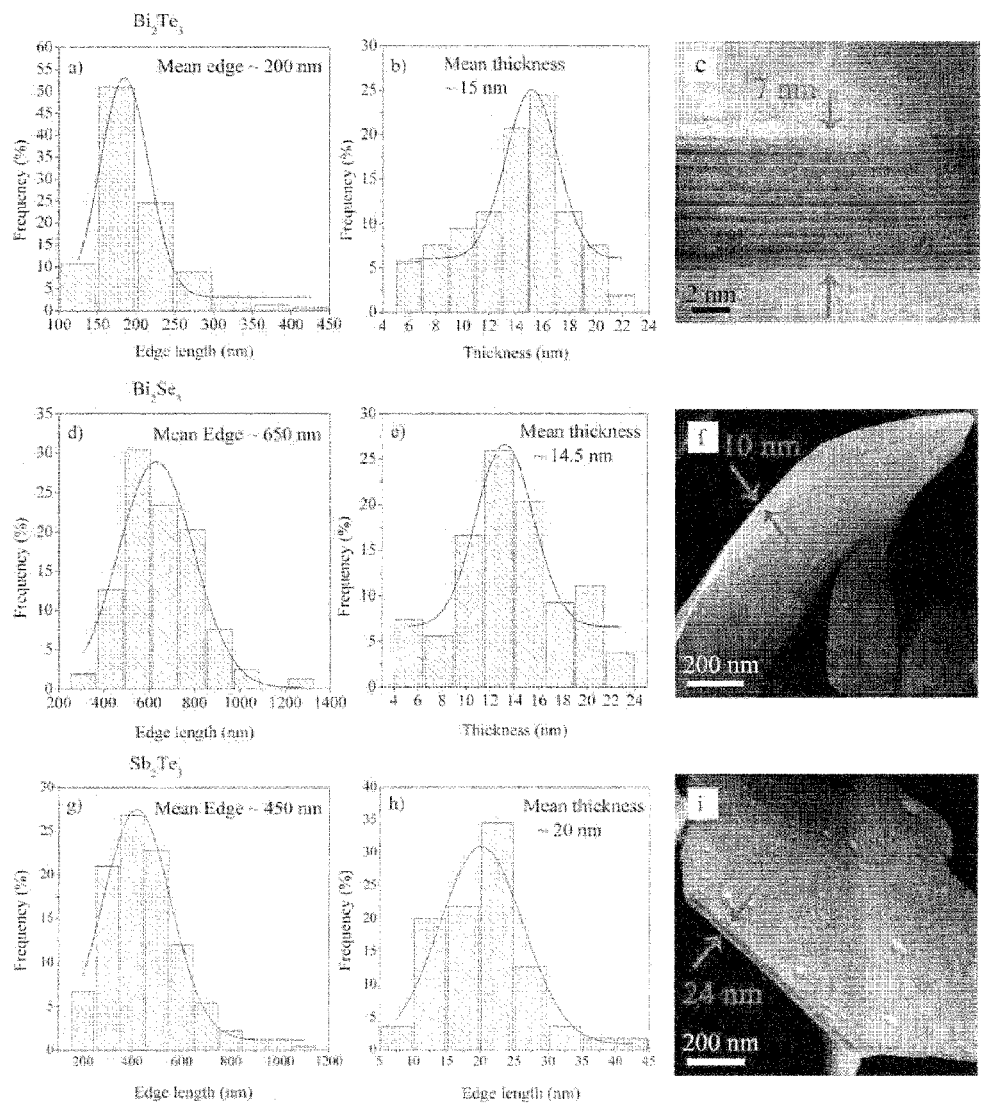
FIG. 4 shows size distribution graphs with fitted Gaussians for a) edge length and b) thickness of $Bi_2Te_3$ nanoplates, d) edge length and e) thickness of $Bi_2Se_3$ nanoplates, and (g) edge length and (h) thickness of $Sb_2Te_3$ nanoplates according to an embodiment of the invention, where c) shows an edge-on TEM image of a $Bi_2Te_3$ nanoplate with a thickness of ~7 nm, f) shows a SEM image of a side-view of a $Bi_2Se_3$ nanoplate with a thickness of ~10 nm, and i) shows a SEM image of a side-view of a $Sb_2Te_3$ nanoplate with a thickness of ~24 nm.
Figure 5:
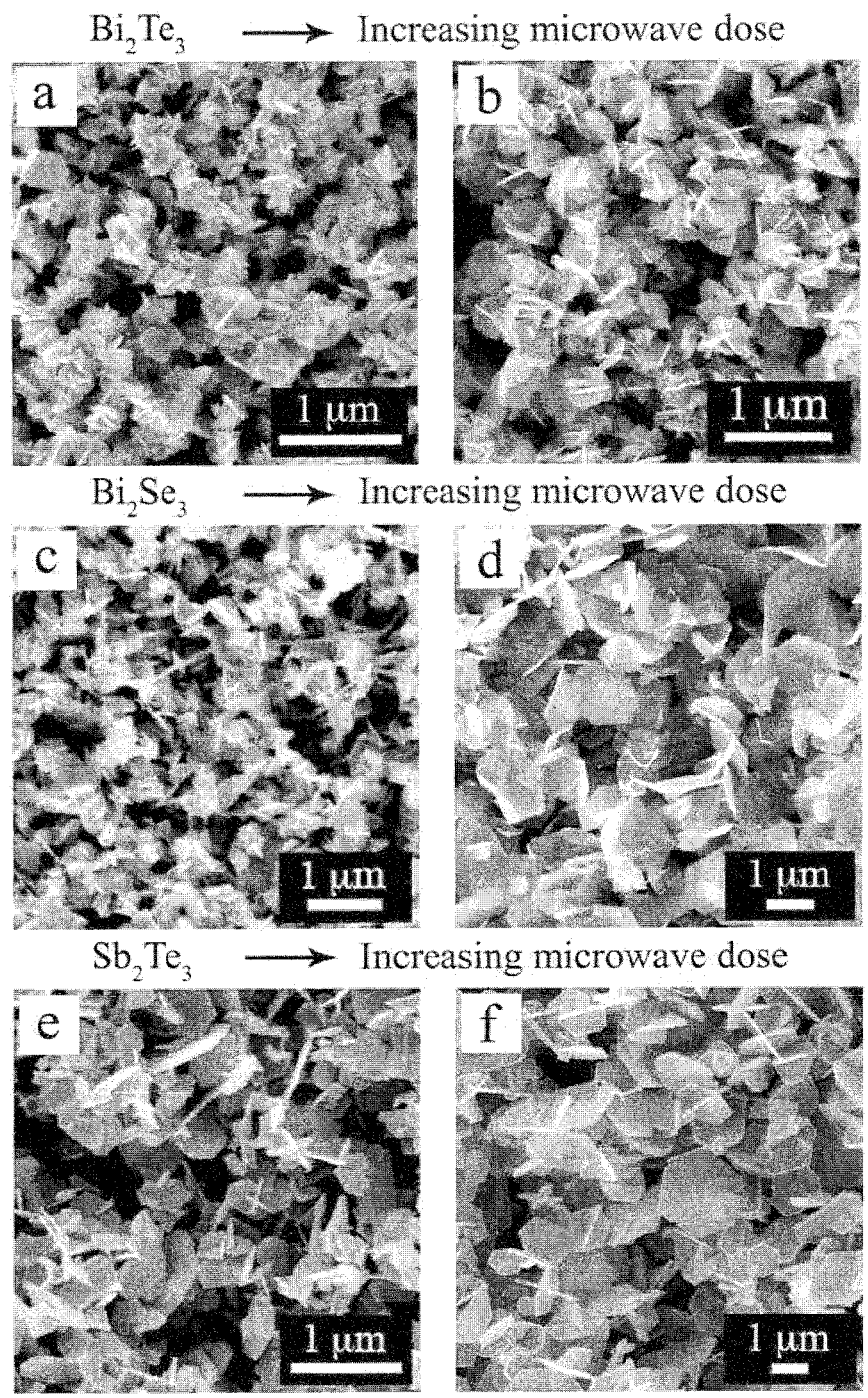
FIG. 5 shows SEM images of $Bi_2Te_3$ nanoplates synthesized in a) 30 seconds and b) 60 seconds, $Bi_2Se_3$ nanoplates synthesized in c) 30 seconds and d) 60 seconds, and $Sb_2Te_3$ nanoplates synthesized in e) 30 seconds and f) 60 seconds using the 1250 W multimode oven according to an embodiment of the invention.

The precipitated doped pnictogen chalcogenides nanoplates can comprise phase-pure rhombohedral crystals of stoichiometric $Bi_2Te_3$ or $Bi_2Se_3$ or $Sb_2Te_3$ as indicated by X-ray diffractometry (XRD), shown in FIG. 1, and energy dispersive X-ray spectroscopy (EDX), shown in FIG. 2. The precipitated doped pnictogen chalcogenides nanoplates are primarily hexagonal nanoplates, as shown in FIG. 3, although, as indicated in FIG. 3a, a small fraction, less than about 5%, of the precipitates are observed as truncated triangles. The thin rod-like structures of FIGS. 3a, 3c, and 3e are nanoplates oriented edge-on to the micrograph plane and are not a third geometry of the nanoparticles. The nanoplates display a distribution of bounding edge dimensions of 100 to 1,200 nm, as plotted in FIG. 4a, d, and g, and thickness of 5 to 20 nm, as plotted in FIGS. 4b, e, and h, for respectively $Bi_2Te_3$ or $Bi_2Se_3$ and $Sb_2Te_3$. Nanoplate thickness is consistent from batch to batch for all pnictogen chalcogenides prepared by the subject microwave method, however the dimensions of the bounding edges increases with an increase in the microwave dose used during the synthesis as illustrated in FIG. 5. The increase in the bounding edge dimensions suggests that lateral growth is thermally activated.

Figure 6:
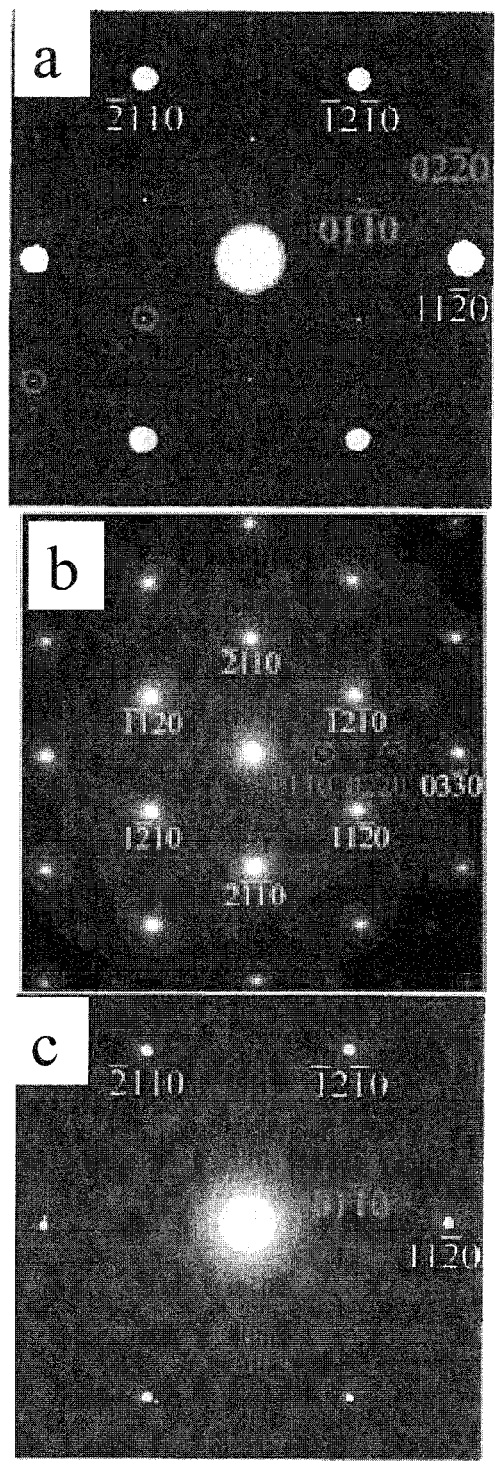
FIG. 6 shows [0001] zone electron diffraction patterns for a) $Bi_2Te_3$, b) $Bi_2Se_3$, and c) $Sb_2Te_3$ nanoplates according to an embodiment of the invention.
Figure 7:
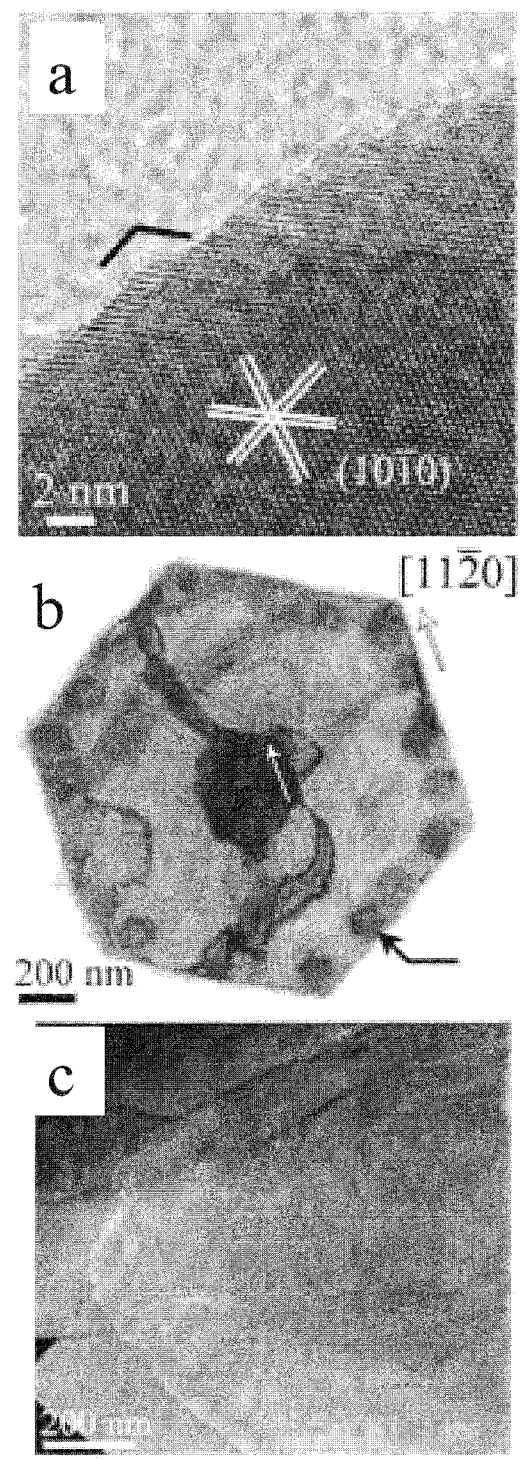
FIG. 7 shows: a) a High resolution TEM image resolving lattice fringes from the bounding $\{10\bar{1}0\}$ planes from a $Bi_2Te_3$ nanoplate where the prismatic $\{10\bar{1}0\}$ planes form bounding facets of the nanoplates and where the ~1 nm surface layer growing parallel to the facets is revealed from the lattice fringe contrast change due to the thickness variation; b) a bright field TEM image from a $Bi_2Se_3$ nanoplate where the black arrow indicates the presence of the island like 'nuclei' and the white arrows indicate the growth of the layers parallel to the parent plate; and c) a High resolution SEM image from a $Bi_2Se_3$ nanoplate.
Figure 8:
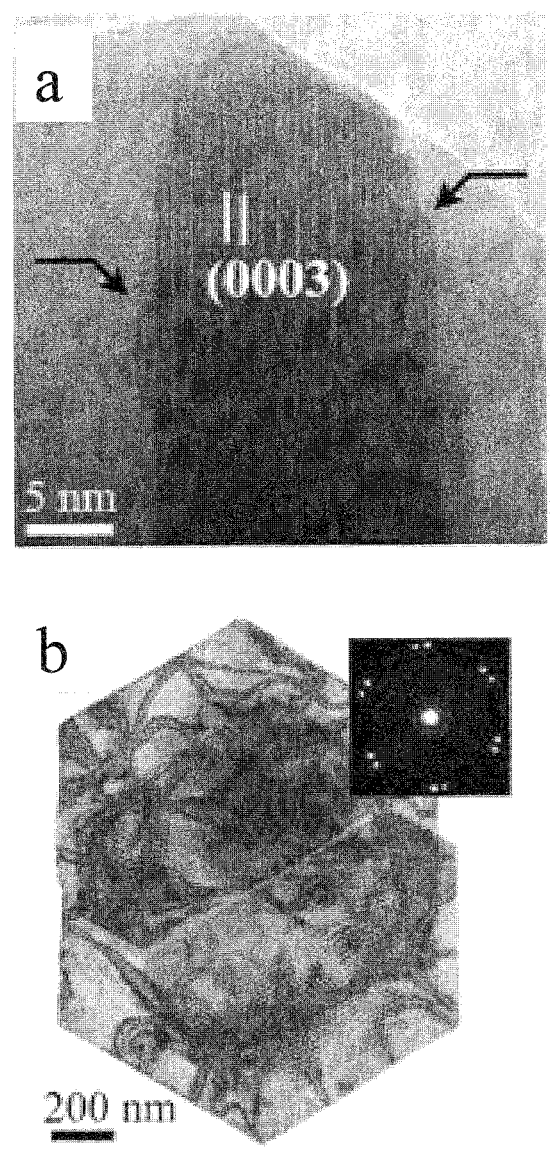
FIG. 8 shows a) a bright field edge-on view of a $Bi_2Te_3$ nanoplate, revealing the approximately 1 nm nano-scale nature of the layers at (0003) planes; and b) Moiré fringes at a layered $Bi_2Se_3$ nanoplate with a corresponding electron diffraction pattern depicting the rotational boundary as an inset.

Bright-field transmission electron microscopy (TEM) studies of individual nanoplates reveal uniform contrast, as indicated in the inset [0001] zone lattice images of FIGS. 3b, d, and f. Spot diffraction patterns, as shown in FIGS. 6a, b, and c, indicate that each nanoplate is a single crystal with the flat faces parallel to the [0001] basal plane and the bounding prismatic edges are the $\{10\bar{1}0\}$ planes, as illustrated in FIG. 7a. The relative orientations of the crystal planes and facets suggest that a higher growth rate occurs along $<11\bar{2}0>$ and $<10\bar{1}0>$ in-plane directions than along [0001] resulting in the plate shape. Faint kinematically forbidden $\{10\bar{1}0\}$ and $\{20\bar{2}0\}$ reflections are seen in electron diffraction patterns, and likely arise from antisite defects and/or incomplete layers. The pnictogen chalcogenides nanoplates of these examples exhibit surface steps, ledges, and hexagonally faceted islands with the bounding ledges aligned to the nanoplate facets, as indicated in FIGS. 7a, b, and c, indicative of layer-by-layer growth of sub-unit-cell ledges. For example, the 1-nm-high ledges along $<11\bar{2}0>$ parallel to the bounding facets seen in high-resolution TEM shown in FIG. 8a correspond to (0003) planes comprised of a five-layer stoichiometric stack of $Bi_2Te_3$, $Bi_2Se_3$ or $Sb_2Te_3$. Moiré fringes and rotated spot patterns, as can be seen in FIG. 8b arise from twist boundaries within each plate or between adjacently stacked plates.

Figure 9:
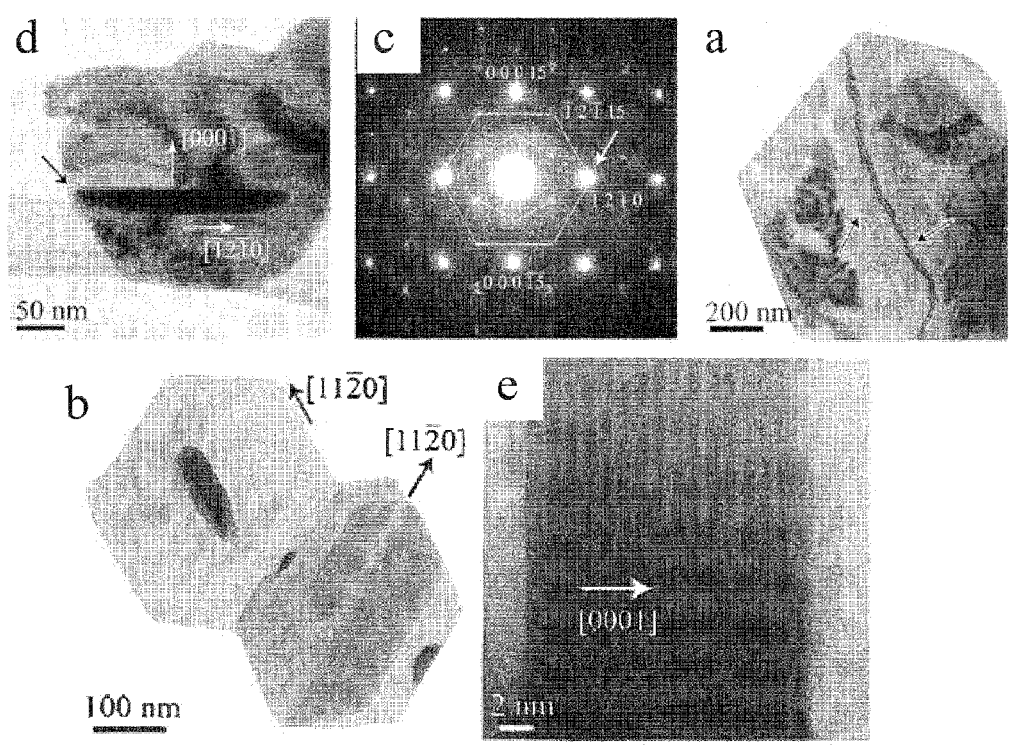
FIG. 9 shows: a) a bright field TEM from a bismuth selenide nanoplate where the arrows indicate two of several discontinuities in the bend contours indicating a local difference in thickness revealing the presence of a surface step or ledge; b) a bright field TEM of two adjacent branched bismuth telluride nanoplates with branch growth along type directions; c) a diffraction pattern from the [10$\bar{1}$0] zone of the branch superimposed with the [0001] zone of the parent nanoplate corresponding to d); d) a bright field TEM of a branched bismuth telluride nanoplate with the branch oriented 90° to the parent crystal; and e) a high resolution TEM from a branch on a bismuth telluride nanoplate revealing the ultra-thin nature along the [0001] direction.

The atomic-level steps are also manifested as bend-contour discontinuities, as indicated in FIG. 9a. In some nanoplates branches originating at parent face centers through growth along $\{11\bar{2}0\}$ planes and $<11\bar{2}0>$ directions common to both the parent and the branch are observed, extending towards the bounding facets of the parent, as shown in FIG. 9b. The branches on the parent nanoplate are shown to always form along a $[11\bar{2}0]$ type direction through analyses of electron diffraction and high resolution electron microscopy. Analysis of the electron diffraction pattern, shown in FIG. 9c, indicates that the branch and the parent crystal share a common $\{11\bar{2}0\}$ type plane and a common $<11\bar{2}0>$ direction. For the branched nanoplate in FIG. 9d, the common direction is $[\bar{1}2\bar{1}0]$. The branches form along the common direction through extensions of the common planes, with the crystals rotated 90° about the common $<11\bar{2}0>$ direction, as indicated in FIG. 9b. The ultrathin branches extend similar to the parent nanoplates along the in-plane direction, with growth suppressed along the [0001] direction, as illustrated in FIG. 9e.

Figure 10:
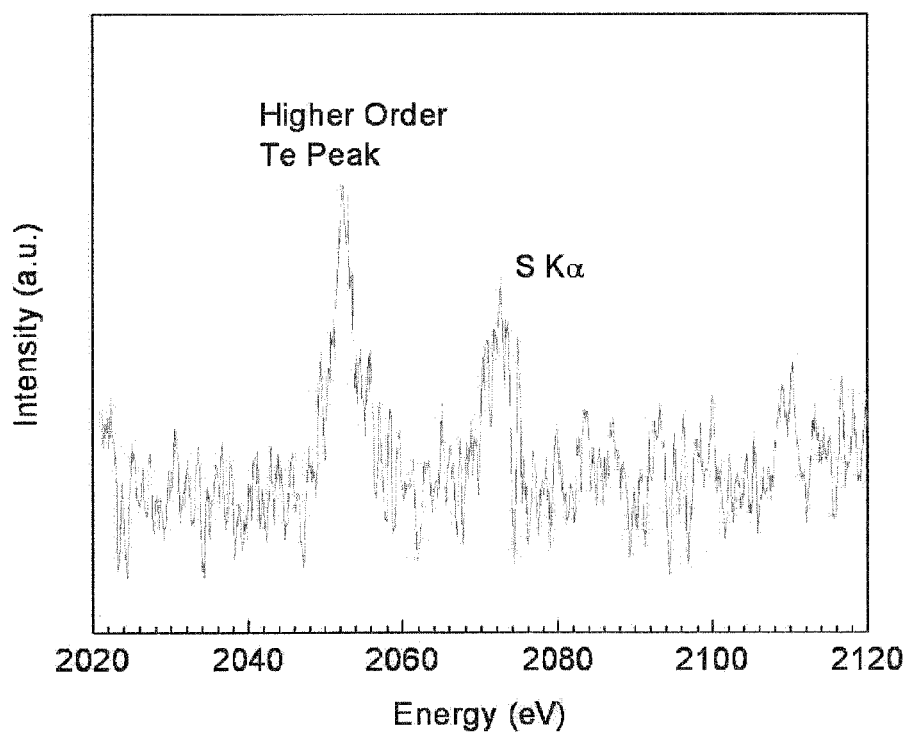
FIG. 10 shows a wavelength dispersive X-ray spectrum obtained using an electron microprobe from a bulk assembly of $Bi_2Te_3$ nanoplates of an embodiment of the invention showing sulfur Kα peak.

In an embodiment of the invention, bulk assemblies of the novel doped pnictogen chalcogenide nanoplates are formed having about 95% to about 97% of the density of the respective bulk pnictogen chalcogenide by cold compaction and sintering of nanoplate powders, experimentally demonstrated using 0.3 to 1 g of nanoplates to form a pellet. Wavelength dispersive X-ray spectroscopy (WDS) measurements on sintered pellets using an electron microprobe revealed $Bi_2Te_3$ that is 1-2% bismuth-rich, $Bi_2Se_3$ that is 1-5% bismuth-deficient, and $Sb_2Te_3$ that is essentially stoichiometric with sulfur dopant contents of about 0.01 to 0.3 atom percent, as illustrated in FIG. 10, for $Bi_2Te_3$ depending on the syntheses condition. The composition and stoichiometry can be controlled to and the pnictogen can range from about 5% rich to about 5% deficient. The sulfur doping level can be less than 0.01% (but greater than 0), in the range of 0.01% to 0.3%, and greater than 0.3%, for example, greater than 0.5%, 1%, 1.5%, 2%, 3%, 4%, 5%, 6%, 7%, 8%, or 9%, in various embodiments of the invention, but less than 10%. The sulfur dopant content is significantly different from that of pnictogen chalcogenide alloys, where sulfur is included at levels in excess of 10 atomic percent.

Figure 11:
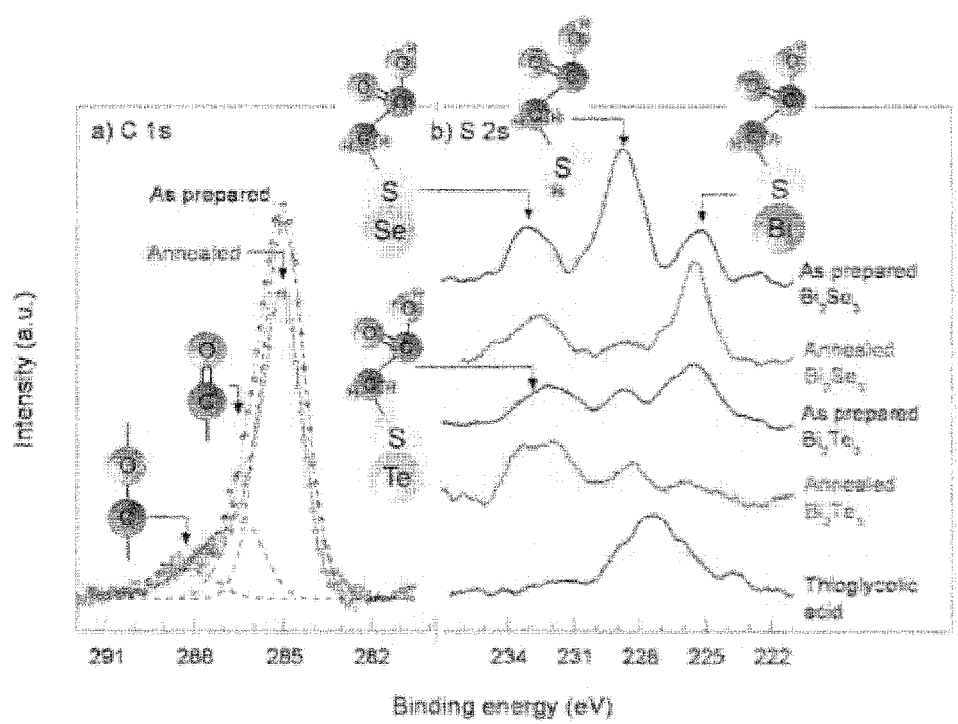
FIG. 11 shows XPS spectra for a) C 1s and b) S 2s core level bands from annealed and un-annealed films of pnictogen chalcogenide nanoplates of an embodiment of the invention with a reference spectrum for thioglycolic acid as a reference for free (un-ligated) SH groups.
Figure 12:
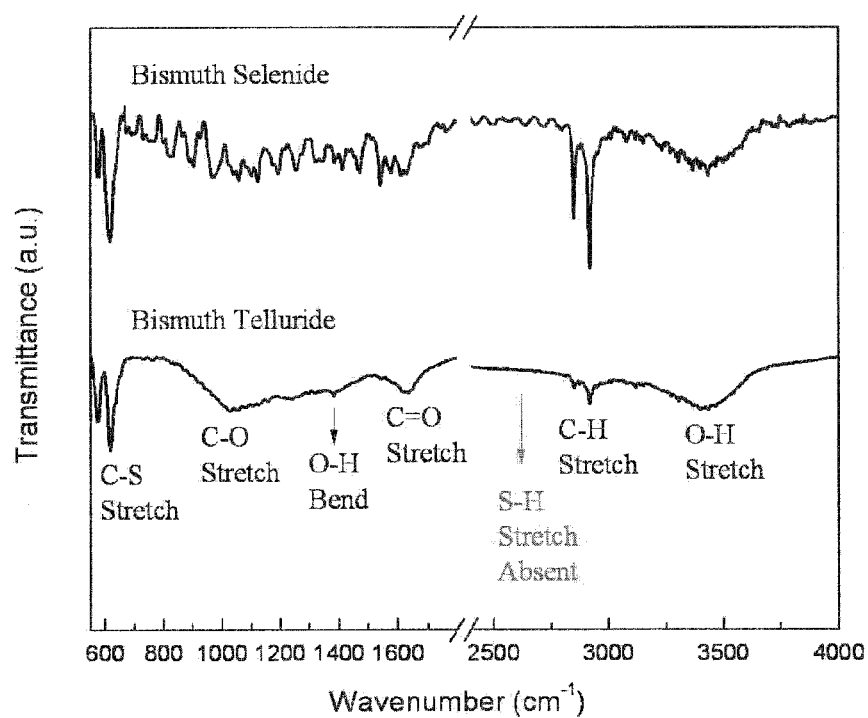
FIG. 12 shows FTIR spectra from $Bi_2Te_3$ and $Bi_2Se_3$ nanoplates of an embodiment of the invention dispersed in KBr pellets, showing the signature of the capping thioglycolic acid.

Core-level spectra acquired by X-ray photoelectron spectroscopy (XPS) from nanoplate assemblies are shown in FIG. 11, where signals from the nanoplates prior to sintering reveal surface thioligation by TGA to the nanoplates, which results in sulfur doping and inhibits oxidation such that handling and storage of dried nanoplate powder is facilitated. The S 2s signal has two sub-bands corresponding to thioligated states of bismuth and the chalcogen, respectively that are distinct, with a central sub-band near 229 eV from unligated TGA. The S 2s sub-band near 225 eV arises from thioligated Bi while the band near 233 eV is due to thioligated chalcogen in the nanoplates. The C 1s ester peaks at 288 and 286 eV shown in FIG. 11a and the C—S bands without detectable S—H bands in the infrared spectra shown in FIG. 12 corroborate thioligation of TGA to the nanoplates. The retention of thioligated bismuth and chalcogen signatures and the C 1s ester sub-bands even upon annealing at 250° C. for 2 hours indicates that oxidation is curtailed, as indicated in the spectra shown in FIG. 11 and FIG. 12. Assuming that sulfur diffusivity in $Bi_2Te_3$ will be similar to or greater than that of Se, a portion of the sulfur from the adsorbed TGA is incorporated into the nanoplate crystal as a substitutional impurity, thus doping the pnictogen chalcogenide nanoplate. The sulfur doping can occur on the surface and/or in the bulk of the nanoplates.

TGA capping inhibits surface oxidation in both the bismuth chalcogenides and the antimony telluride, but is most effective in the case of $Bi_2Se_3$. XPS spectra, as shown in FIGS. 13a) and h), of doped $Bi_2Se_3$ nanoplates show both Bi 4f bands at ~158 eV and Se 3d band at ~53.5 eV characteristic of unoxidized bismuth selenide, but the 58.5 eV Se 3d band suggests some oxygen and/or sulfur incorporation. XPS spectra of doped $Bi_2Te_3$ nanoplates, as shown in FIGS. 13c) and d), exhibit a large Bi 4f band at ~158.5 eV from unoxidized Bi, along with a small oxide sub-band at 159.5 eV, indicating curtailed oxidation. The overlaid ~161 eV S 2p sub-band arises from TGA ligated to bismuth. A strong $TeO_x$ signature at ~576.5 eV and a weak unoxidized Te 3d sub-band at ~573 eV indicates a high degree of Te oxidation in $Bi_2Te_3$, consistent with the higher oxidation potential of Te than Se and Bi. From the sub-band intensities it can be estimated that ~75-80% of the surface Te atoms are oxidized. XPS spectra of doped $Sb_2Te_3$ nanopiates, as shown in FIGS. 13e) and f), exhibit a large unoxidized Te 3d band at ~573 eV and a small $TeO_x$ sub-band at ~576.5 eV. The Sb 3d spectra, however, show stronger oxide sub-band at ~530.5 eV compared to the unoxidized Sb band at ~529 eV along with the overlapping O 1s band at 531 eV. About 60-65% of the surface Sb atoms appear to be oxidized, indicating a high degree of Sb oxidation compared to Te in the $Sb_2Te_3$ nanoplates. Annealed films stored at room temperature for four months did not show any sign of additional oxidation, as observed for the annealed bismuth selenide film.

Figure 14:
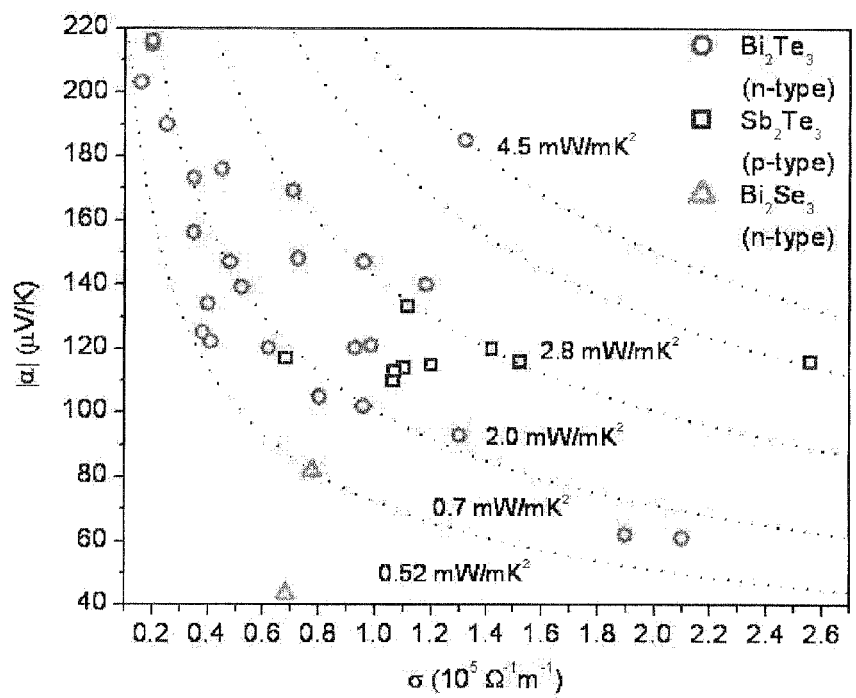
FIG. 14 shows a plot of Seebeck coefficient versus electrical conductivity for the un-optimized sintered pellet shaped bulk assemblies of pnictogen chalcogenide nanoplates according to an embodiment of the invention along with isocontours of power factor $\alpha^2\sigma$.

Thermoelectric measurements, employing well-established techniques, on the bulk assemblies of doped pnictogen chalcogenide nanoplates reveal negative Seebeck coefficients for the bismuth chalcogenides, particularly $-220<\alpha<-90$ μV/K for $Bi_2Te_3$ and $-80<\alpha<-40$ μV/K for $Bi_2Se_3$, and a positive Seebeck coefficient for antimony telluride, particularly $105<\alpha<135$ μV/K, with absolute value of α shown in FIG. 14. Embodiments of the invention can achieve Seebeck coefficients of −300 to −60 μV/K for $Bi_2Te_3$, −250 to −40 μV/K for $Bi_2Se_3$, and 90 to 200 μV/K for $Sb_2Te_3$.

The signs of the Seebeck coefficients for bismuth selenide and antimony telluride nanoplates are consistent with the n- and p-type behaviors exhibited by their respective bulk counterparts, respectively. For $Bi_2Te_3$, a negative Seebeck coefficient indicates a majority carrier inversion, in contrast to the non-nanostructured bulk counterpart. Stoichiometric and bismuth rich compositions of $Bi_2Te_3$ are strongly p-type, where bismuth anti-site defects act as acceptors. The n-type character exhibited by the bulk assemblies of the subject doped pnictogen chalcogenide nanoplates comprising Bi deviate from bulk defect-chemistry and/or electronic structure despite being composed of stoichiometric or bismuth rich nanoplates. This inversion to n-type behavior appears to be a consequence of sulfur doping, as pellets obtained from nanoplates lacking TGA show p-type behavior, implying surfactant induced doping. Bulk $Bi_2Te_3$ alloyed with 2% sulfur. sulfur levels more than an order of magnitude greater than in the bulk assemblies of the novel doped $Bi_2Te_3$ nanoplates, are known to display a majority carrier inversion. $Bi_2Te_3$ with a configuration having the S atom from TGA bonded to a surface Te atom is identified to be a donor, which is consistent with the XPS measurements, as indicated in FIG. 11.

Table 1, below, provides thermoelectric properties and figures of merit for pellets of the bulk assemblies of pnictogen chalcogenide nanoplates. The uncertainties in $\sigma$, $\alpha$, $\kappa$ and ZT are about 2%, 2%, 5% and 7%, respectively. For $\kappa_{L1}$ values, a Lorenz number of $1.5 \times 10^{-8}$ $W\Omega/K^2$ for a degenerate semiconductor was used to calculate the electronic component of the thermal conductivity $\kappa_e$ and subtracted to extract the lattice contribution. Since the exact value of the Lorenz number for the nanoplate composition is currently unknown, an estimate of the electrical conductivity contribution to the total thermal conductivity was made using the value 1.5 $W\Omega/K^2$ for a degenerate semiconductor. This allows the determination of an electrical conductivity contribution of about 50% for $Bi_2Te_3$ and 85% for $Sb_2Te_3$. Alternately the lattice thermal conductivity can be obtained from the intercept on the thermal conductivity axis on the plot of total thermal versus electrical conductivity, shown in FIG. 15, assuming the compounds follow the Weidemann-Franz law. The intercept on the x axis in FIG. 15 was used to obtain the lattice contribution, $\kappa_{L2}$. The percent improvement in the ZT is calculated from the highest ZT value reported for pure bulk pnictogen chalcogenides regardless of stoichiometry; with the ZT value for the $Bi_2Te_3$ pellet of the second row represent an increase of 85% over pure bulk $Bi_2Te_3$ having the identical stoichiometry.

rily carried out to decrease the lattice scattering contribution of thermal conductivity $\kappa_L$ because of alloying-induced phonon scattering, and often results in a power factor decrease due to low electrical conductivity, bulk assemblies of doped pnictogen chalcogenide nanoplates prepared by the subject microwave methods display $\kappa_L$ values that are below the alloy-limit with sub-atomic-percent sulfur doping while maintaining a high power factor.

Figure 15:
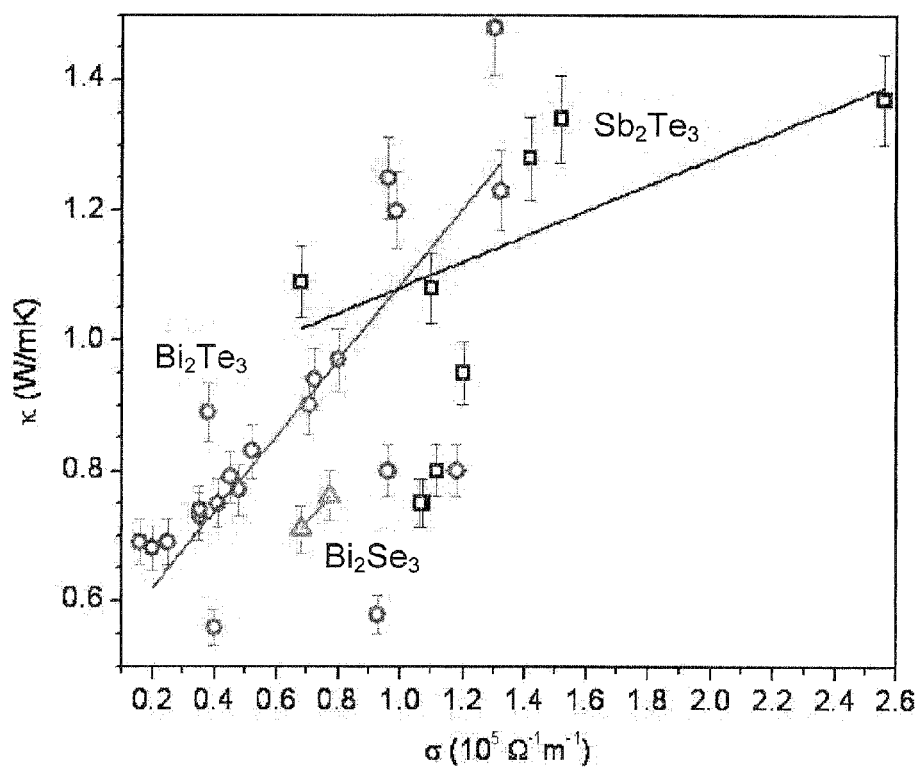
FIG. 15 shows plots of thermal conductivity versus electrical conductivity for the sintered pellet shaped bulk assemblies of pnictogen chalcogenide nanoplates according to an embodiment of the invention, according to the Weidemann-Franz law assuming constant Lorenz number for each pnictogen chalcogenide system with the slope of the plot for each system yields the Lorenz number and the intercept gives the lattice thermal conductivity for $Bi_2Te_3$ (○), $Bi_2Se_3$ (Δ), and $Sb_2Te_3$ (□).

The measured thermal conductivity is about $0.5 < \kappa < 1.4$ W/mK for all bulk assemblies of doped pnictogen chalcogenide nanoplates according to embodiments of the invention, as illustrated in FIG. 15, which are about 40 to 60% below bulk K values for $Bi_2Te_3$ and $Sb_2Te_3$ and about 70 to 75% below that for bulk $Bi_2Se_3$. This is a particularly dramatic decrease in $\kappa_L$ in view of the high electrical conductivity contribution, which tends to increase the total thermal conductivity. Subtracting the electronic thermal conductivity contribution $\kappa_e$ estimated using the Weidemann-Franz law from the total thermal conductivities $\kappa$, an approximately 60 to 70% decreased in $\kappa_L$ results relative to that of bulk pnictogen chalcogenide. The $\kappa$ and $\kappa_L$ values of the present doped single-component compounds are similar to ball-milled nanostructured p-type alloys; however, the high energy intensive ball milling has not yielded n-type materials with high ZT, as is that obtained for the bulk assemblies of doped pnictogen chalcogenide nanoplates according to an embodiment of the invention. Producing such low $\kappa_L$ values by nanostructuring without alloying is unprecedented. The $\kappa_L$ decrease is nearly constant for all doped pnictogen chalcogenides studied, and is independent of sulfur content or composition, as indicated in FIG. 15 and Table 1, above. The $\kappa$ varies by only a factor of about 2 due to the similarity of nanostructures, resulting in nearly identical $\kappa_L$ although $\sigma$ varies by about an order of magnitude due to alterations in the electronic structure induced by doping.

Figure 17:
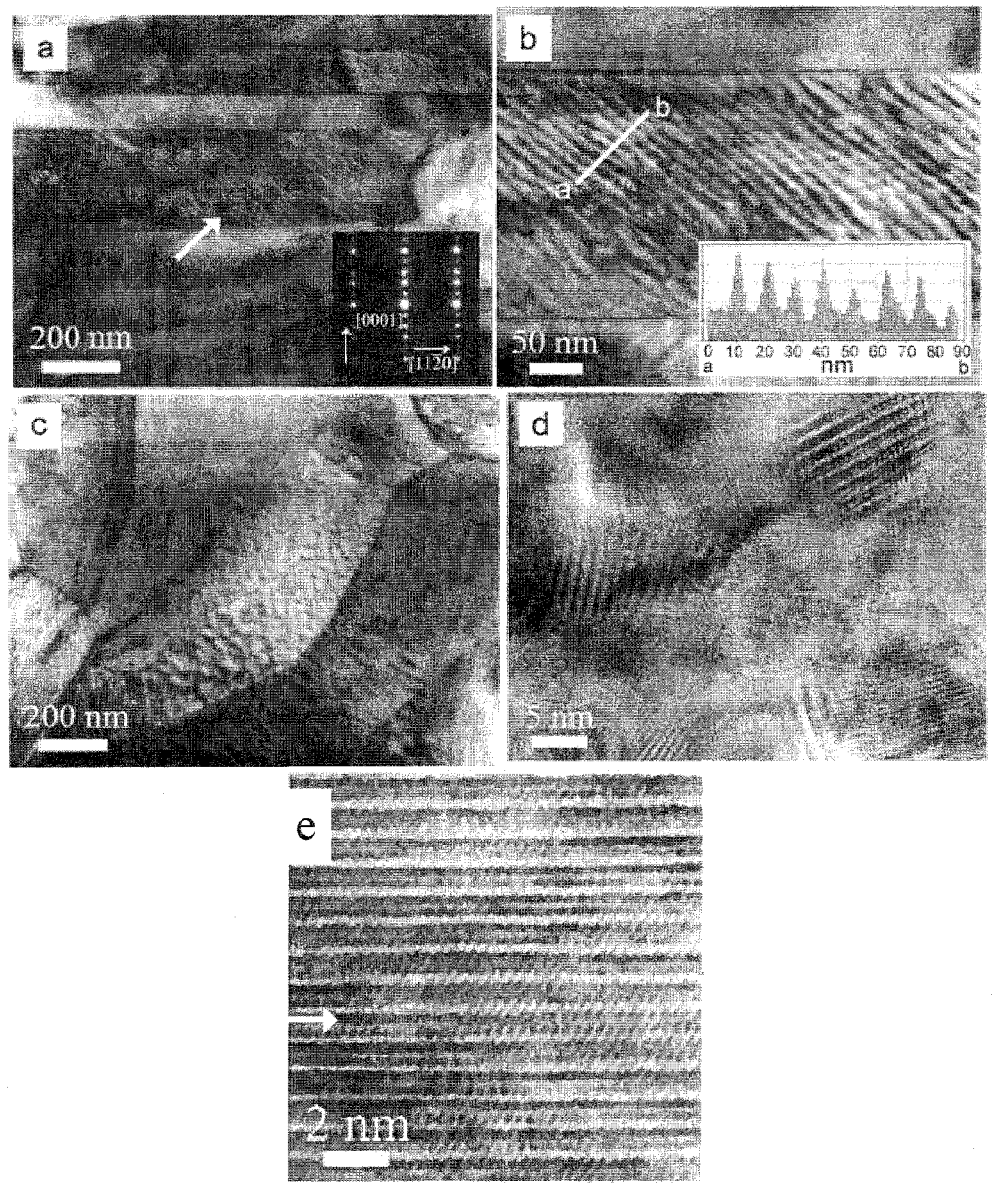
FIG. 17 shows: a) a TEM micrograph from a bulk assembly of $Bi_2Te_3$ nanoplates according to an embodiment of the invention where the inset shows electron diffraction from the [10$\bar{1}$0] zone of a grain and the arrow points to the regular contrast representing structural modulation in the grain; b) a high-magnification TEM image of a grain from the $Bi_2Te_3$ pellet with an approximately periodic contrast pattern representing the structural modulation along the (10$\bar{1}$10) planes where the inset shows the contrast profile along the white line a-b on the grain indicating the approximately 10 nm period of the structural modulation; c) a plan-view TEM micrograph from a $Bi_2Te_3$ pellet with grain contrast originating from high-angle grain boundary between stacked grains that display Moiré fringes; d) a TEM image showing ~10 nm $Bi_2Te_3$ nano-inclusions; and e) a cross-section high resolution micrograph where the arrow indicates a planar defect where the images are from different areas of the pellet but these microstructural features reside homogeneously throughout the sintered pellet.

The low $\kappa_L$ values reflect 50-100 nm grains within the bulk assemblies of doped pnictogen chalcogenide nanoplates and the 5-10 nm scale structural modulations and inclusions within each grain. As shown in FIG. 17 for various sites of a sintered pellet, transmission electron micrographs and elec-

TABLE 1

Thermoelectric Properties and Figures of Merit for Bulk Assemblies of Doped Pnictogen Chalcogenide Nanoplates

|  | $\sigma$ $10^5 \Omega^{-1} m^{-1}$ | $\alpha$ $\mu V/K$ | Type | $\kappa$ W/mK | $\kappa_{L1}$ W/mK | $\kappa_{L2}$ W/mK | ZT @ 300 K | % ZT increase |
|---|---|---|---|---|---|---|---|---|
| $Bi_2Te_3$ | 1.30 | −185 | n | 1.23 | 0.64 | 0.51 | 1.10 | 26 |
| $Bi_2Te_3$ | 1.20 | −140 | n | 0.80 | 0.27 | 0.51 | 0.87 | — |
| $Sb_2Te_3$ | 2.50 | 116 | p | 1.36 | 0.24 | 0.86 | 0.74 | 51 |
| $Bi_2Se_3$ | 0.77 | −82 | n | 0.70 | 0.35 | 0.34 | 0.22 | 144 |

Figure 13:
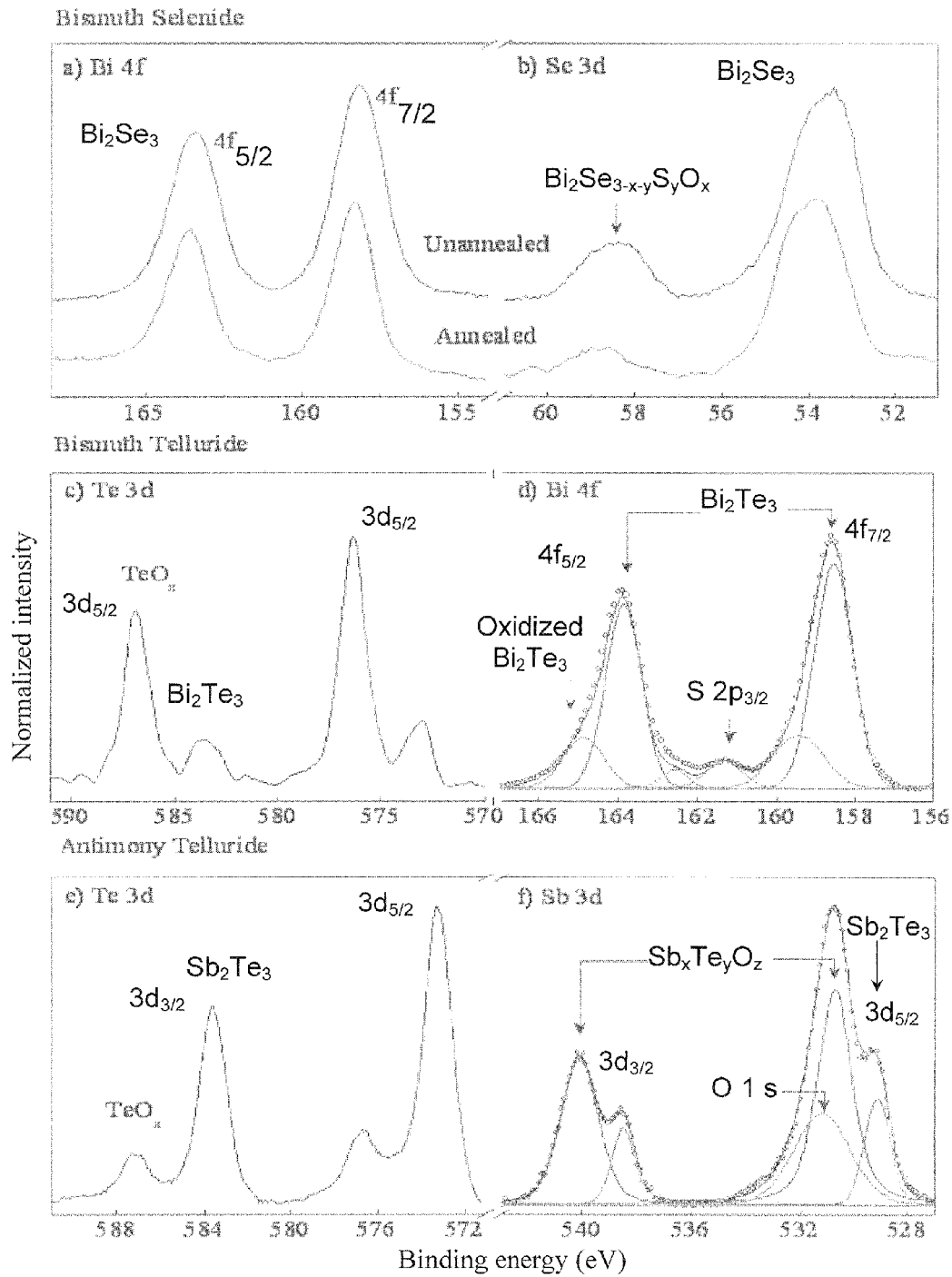
FIG. 13 shows XPS core-level spectra from doped: a) and b) $Bi_2Se_3$; c) and d) $Bi_2Te_3$; and e) and f) $Sb_2Te_3$ pnictogen chalcogenide nanoplate films of an embodiment of the invention.
Figure 16:
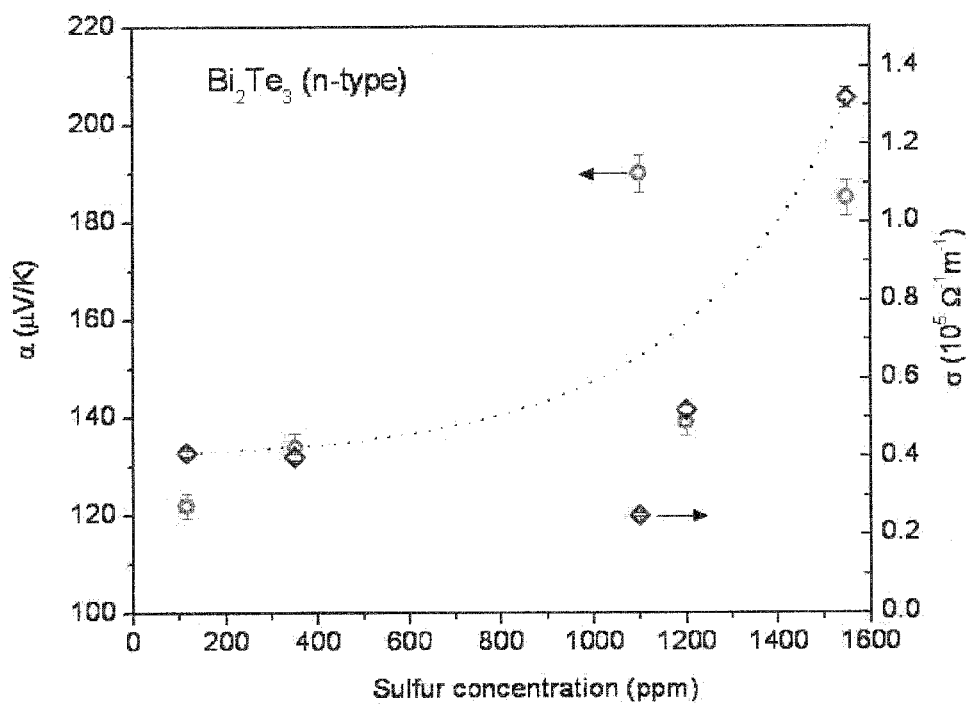
FIG. 16 shows a plot of Seebeck coefficient (○) and electrical conductivity (◇) for the sintered $Bi_2Te_3$ nanoplate pellets of an embodiment of the invention. The dotted curve provides a guide line.

Un-optimized sintered pellets exhibit high room-temperature electrical conductivity $\sigma$ of about 0.3 to $2.5 \times 10^5$ $\Omega^{-1}m^{-1}$, as indicated in FIG. 13, which is similar to reported values for the respective bulk compounds, about 2 to 3 times higher than state-of-the-art p- and n-type alloys, and about 50 to 100% higher than a nanostructured p-type $Bi_2Te_3$—$Sb_2Te_3$ alloy. Seebeck coefficient and electrical conductivity values are sensitive to the sulfur content, as indicated in FIG. 16. The sulfur content can be adjusted by the synthesis conditions employed. The subject synthetic methods for the preparation of the doped pnictogen chalcogenide nanoplates allows Fermi level engineering of the nanoplates through controlled and optimized doping to enhance ZT.

In contrast to bulk, $Bi_2Te_3$ alloyed to 20% to 70% with $Sb_2Te_3$ (p-type) and $Bi_2Se_3$ (n-type), where alloying is primatron diffraction for the pellets show 50-100 nm thick plate-shaped grains that span about 0.5 to 2 $\mu$m laterally, corresponding to coalescence of 5 to 10 stacked nanoplates during sintering. The relatively large grains show planar defects formed at nanoplate interfaces during sintering due to imperfect stacking, as can be seen in FIG. 17e.

Extensive nanometer-scale structural modulations occur in the bulk assemblies of doped pnictogen chalcogenide nanoplates that are typified by the periodic contrast in grains as can be seen in FIG. 17b. High angle grain boundaries exist between stacked grains and inclusions, as shown in FIGS. 17c and d, respectively. The presence of these multiple interfaces at different length scales, from 1 to 100 nm, scatter low-to-medium wavelength phonons, minimizing $\kappa_L$, consistent with calculations for the κ of the single-component pellets. The Moiré fringes shown in FIG. 17*c* corroborate the presence of multiple domains twisted in the plane of the bulk assemblies within each grain comprised of multiple doped pnictogen chalcogenide nanoplates.

Figure 18:
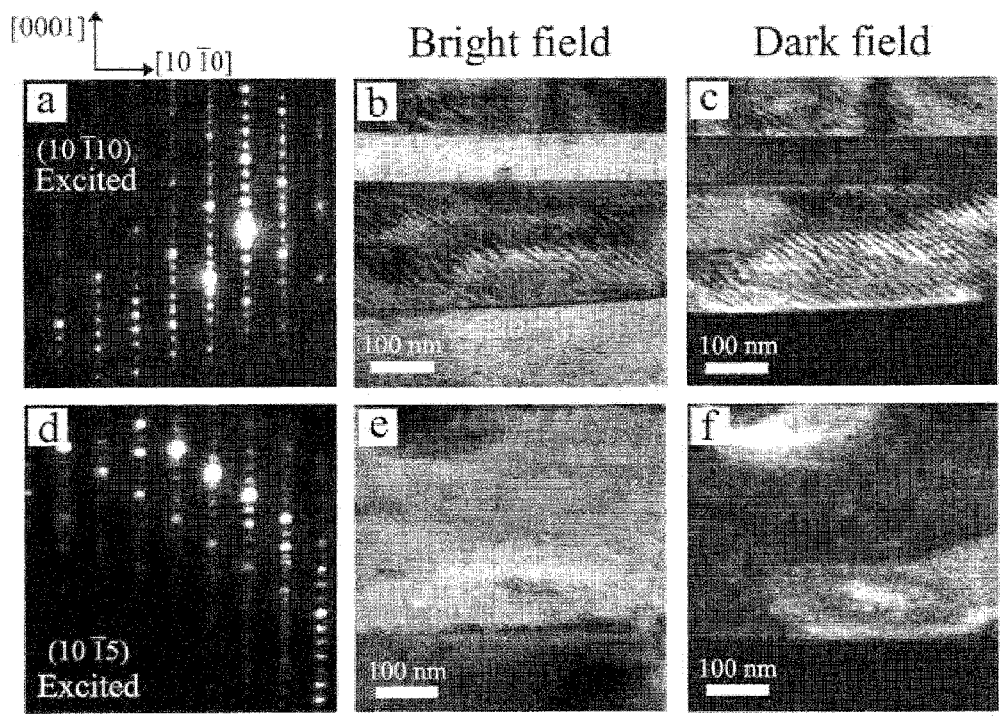
FIG. 18 shows results of a detailed tilting experiment to verify the structural origins of the modulation as indicated by: a) (11$\bar{2}$0) zone electron diffraction pattern with the (10$\bar{1}$10) reflections excited and its corresponding b) bright field and c) dark field cross-section transmission electron micrograph (TEM) from the bulk assembly of $Bi_2Te_3$ nanoplates pellet according to an embodiment of the invention showing grains with an approximately periodic contrast pattern representing the structural modulation along the (10$\bar{1}$10) planes making ~39° with the (0001) basal plane; and d) the pellets (11$\bar{2}$0) zone electron diffraction pattern with the (10$\bar{1}$5) reflections excited and its corresponding e) bright field and f) dark field TEM showing absence of the fringe contrast.

Subsequent tilting experiments and electron diffraction analyses, as shown in FIG. 18, confirm the structural origin of the periodic contrast. The cross-section bright field transmission electron micrograph (TEM) of the $Bi_2Te_3$ pellet in FIG. 18 shows plate-like grains stacked on each other. Electron diffraction analyses show that the grains grow along the (0001) basal planes with high angle twist grain-boundaries. The stacked grains exhibit a characteristic fringe contrast as can be seen in FIG. 18. Detailed tilting experiment confirm the fringes are intrinsic in nature and not associated with Moiré or grain boundary contrast or phase separation. Centered bright field and dark field images were recorded under different excited Bragg reflections. The fringes show strong contrast under reflections such as $(10\bar{1}10)$, as in FIGS. 19*a*), *b*), and *c*), while under reflections such as (001) and $(10\bar{1}5)$, shown in FIGS. 19*d*), *e*) and *f*), are invisible. These observations are consistent with observed modulations that are structurally associated with a modulating strain field with the wave vector parallel to $(10\bar{1}10)$ planes and wavelength of about 10 nm ruling out the presence of any phase separation such as spinoidal decomposition. The intrinsic structural origin of the fringes is further confirmed by the observation that the fringe spacing is about 10 nm with a 39° inclination with the basal plane throughout the pellet.

Figure 19:
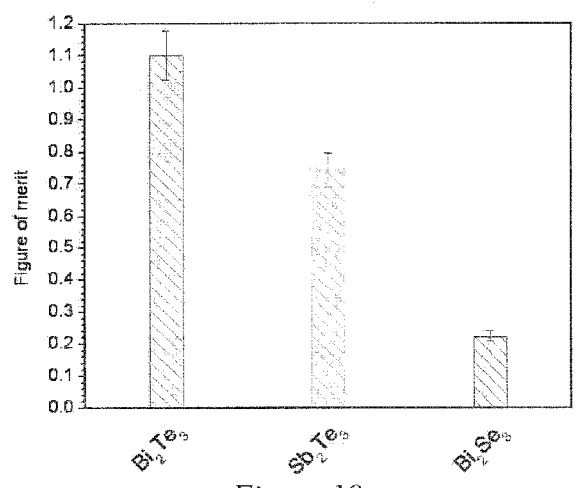
FIG. 19 is a graph indicating room temperature dimensionless figure of merit ZT of the best pellet shaped bulk assemblies of pnictogen chalcogenide nanoplates according to an embodiment of the invention.

From the above parameters, room temperature ZT values as high as about 1.5 are determined, as plotted in FIG. 19 and recorded in Table 1 for the bulk assemblies of doped pnictogen chalcogenide nanoplates, which is an approximately 50% improvement over state-of-art alloys. The ZT value for each pnictogen chalcogenide represent a 2 to 4 fold improvement over the corresponding bulk counterparts having the same composition and an improvement of about 1.5 to 3 fold over the highest values observed in each material system, as indicated in Table 1. Hence the bulk assemblies of doped pnictogen chalcogenide nanoplates provide p-type and n-type compounds that display enhanced room temperature ZT without alloying, and is critical for a solid-state cooler with a high coefficient of performance. All bulk assemblies of doped pnictogen chalcogenide nanoplates exhibit a significant reduction in thermal conductivity, where the ZT reduces to a function solely of the thermopower that is controllable through doping. By control of the synthesis of the doped pnictogen chalcogenide nanoplates, sintering and heat treatment processes of the bulk assemblies, optimal doping and size control can result in even greater ZT increases, even to a range of 2 to 3.

According to an embodiment of the invention, micrometer-thick porous films of fused doped pnictogen chalcogenide nanoplates are obtained by drop-casting the nanoplates onto a glass substrate and annealing the drop-casted nanoplates for 1-10 hours at temperatures from 100° C. up to the melting point of each material.

Figure 20:
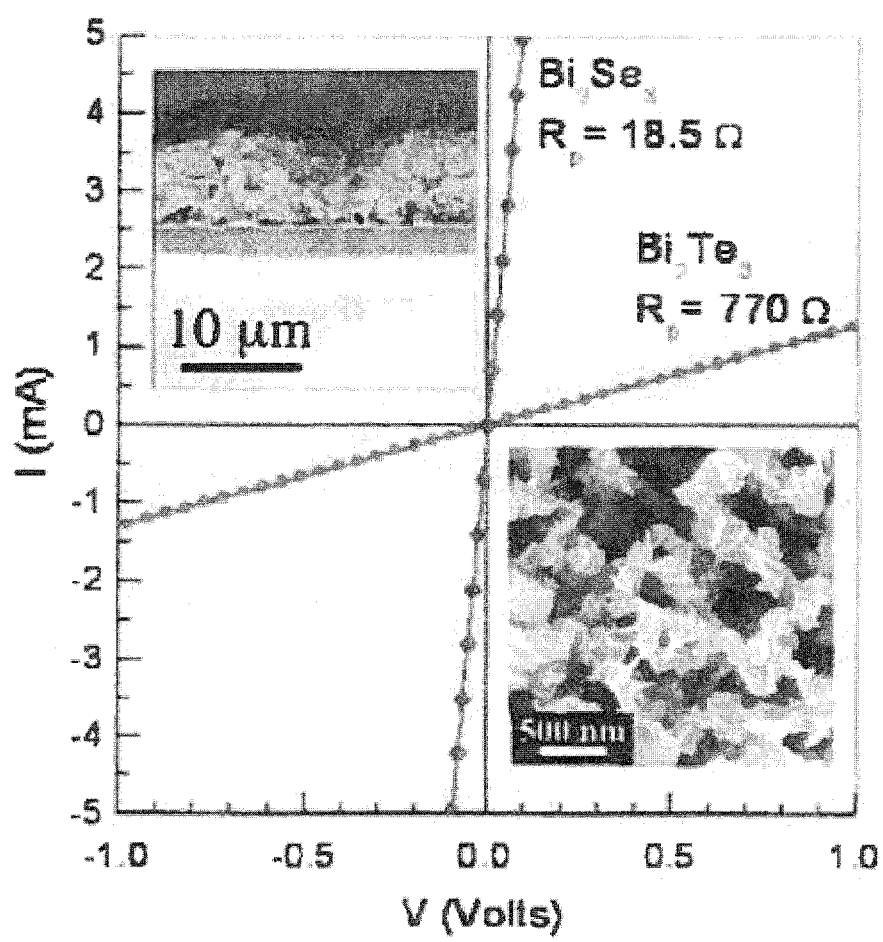
FIG. 20 shows a plot of I-V characteristics of $Bi_2Te_3$ and $Bi_2Se_3$ annealed nanoplate films according to an embodiment of the invention, where the top left inset is a side-view SEM of a nanoplate film and the right bottom inset is an SEM image of a porous annealed film.

For the experimental examples, the nanoplates were drop-casted onto a glass substrate and annealed in vacuum at 250° C. for 2 hours. These films exhibit linear I-V characteristics, as shown in FIG. 20. Film sheet resistance ranges from 10s to 100s of Ω, equivalent to ρ values of about $10^5$ to $10^6$ μΩcm, which are 2 to 3 orders of magnitude greater than the bulk values, presumably due to the high film porosity of the fused film. In certain embodiments, the fused film is porous and has less than 60% of the density of the equivalent bulk pnictogen chalcogenide.

Figure 21:
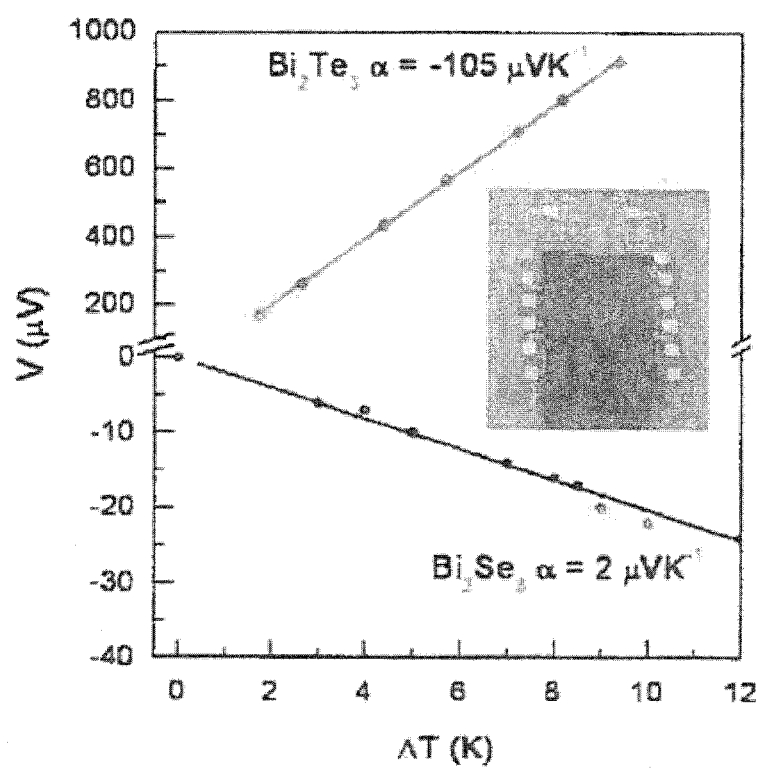
FIG. 21 shows a plot of Seebeck coefficient measurements of $Bi_2Te_3$ and $Bi_2Se_3$ annealed nanoplate films where the inset shows an optical image of an annealed nanoplate film with gold electrodes on glass of the measuring circuit.

Thermoelectric measurements of nanoplate film assemblies with lithographically patterned micro-heaters reveal Seebeck coefficients with opposite signs for the doped bismuth chalcogenides, as shown in FIG. 21, in contrast for that of known bulk and thin films counterparts. Doped $Bi_2Te_3$ nanoplate films show n-type characteristics with an average Seebeck coefficient α of about −107±5 μV/K, while doped $Bi_2Se_3$ nanoplate films exhibit p-type behavior with α of about 5±3 μV/K. This carrier-type reversal can be attributed to alteration in the Fermi level and the density of states near the Fermi level due to sulfur doping that arises from surface thioligation and sulfur injection into the nanoplate. This inference is consistent with carrier-type reversal induced by increasing sulfur and chalcogen content in bismuth chalcogenides. Due to strong self-compensating mechanisms, $Sb_2Te_3$ does not show sign reversal on sulfur doping remaining strongly p-type. Hence, the rapid synthetic method according to an embodiment of the invention, allows Fermi level engineering of the nanocrystals through controlled and optimized doping, to enhance ZT.

The thermal conductivities of fused films of doped pnictogen chalcogenide nanoplates were measured by a hot probe technique yielding values of κ of about 0.35 $Wm^{-1}K^{-1}$ for the $Bi_2Te_3$ films and about 0.52 $Wm^{-1}K^{-1}$ for $Bi_2Se_3$. These extremely low values of thermal conductivity include contribution due to film porosity, which must be carefully balanced to preserve good electrical conductivity. A higher thermal conductivity of the $Bi_2Se_3$ film compared to the $Bi_2Te_3$ film reflects that of the bulk pnictogen chalcogenides.

According to an embodiment, dense fused films of doped pnictogen chalcogenide nanoplates can be formed through deposition techniques such as inkjet printing and spray/drop-casting. In certain embodiments, the figure of merit ZT for the fused films can approach and exceed the bulk counterparts. In one embodiment, the Seebeck coefficients of the nanoplate films can reach −300 μV/K for $Bi_2Te_3$ and 250 μV/K for $Bi_2Se_3$. According to an embodiment, fused films can be fabricated having a density of 85% or more of the equivalent bulk pnictogen chalcogenide.

MATERIALS AND METHODS

Nanoplate synthesis: Thioglycolic acid ($CH_2COOHSH$, 95%), anhydrous bismuth chloride ($BiCl_3$), antimony chloride ($SbCl_3$), 1,5-pentanediol (95%), technical grade trioctylphosphine (TOP). 200 mesh tellurium shots and 100 mesh selenium shots were obtained from Sigma Aldrich and used without further purification. In a typical small-scale synthesis, 10 mg of tellurium (~0.08 mmol) (or 6 mg of selenium (~0.08 mmol) for $Bi_2Se_3$) was added to 2 to 5 mL TOP and heated in the microwave oven for 90 to 120 seconds to obtain a colorless to faint yellow TOP-chalcogen complex. A bismuth or antimony chloride solution was prepared by adding 13 mg (0.04 mmol) of $BiCl_3$ or 10 mg (0.04 mmol) $SbCl_3$ to 2.5 to 10 ml 1-5 pentanediol followed by sonication for 15 minutes. Addition of 100 to 350 μL of thioglycolic acid transforms the bismuth chloride solution to a yellow color due to formation of thiolated bismuth complex. The solutions with TOP-chalcogen and thioligated bismuth or antimony were mixed and irradiated with microwaves in a common domestic Panasonic microwave oven rated at 1250 W for 30 to 60 seconds. Alternately a single-mode variable power 300 W CEM microwave equipped with an IR sensor for temperature control was used for synthesis. Gram quantities of nanocrystals were obtained in less than 5 minutes. The bismuth chalcogenide nanoplates are ultrathin, about 5 to 20 nanometers thick and have tunable edge lengths. The antimony telluride nanoplates are slightly thicker, about 7 to 30 nm. Synthesis time of 60 s at a microwave power of 1250 W in the multi-mode oven results in: $Bi_2Te_3$ nanoplates with edge lengths of about 150 to 300 nm and a mean thickness of about 15 nm; $Bi_2Se_3$ nanoplates with edge lengths of about 400 to 1000 nm and a mean thickness of about 15 nm; and $Sb_2Te_3$ nanoplates with edge lengths of about 200 to 700 nm and a mean thickness of about 20 nm. Higher microwave doses increases the edge length without altering the thickness. Typical synthesis times of 60 seconds resulted in yields of 80 to 90 percent.

Pellet fabrication: Bulk assemblies of doped pnictogen chalcogenide nanoplates were fabricated as pellets from dried doped pnictogen chalcogenide nanoplates through cold-compaction under pressure using a hydraulic press. The green pellets of about 60 to 70 percent of bulk density were sintered under vacuum at 350° C. for 90 minutes using the double crucible method to yield 97 to 98 percent of bulk density measured by a pneumatic densitometer. The pellets measured about 6 mm in diameter and 2 to 3 mm in thickness and were cut and polished appropriately for subsequent measurements. The sintering can be carried out at temperatures less than the melting point of the pnictogen chalcogenide (for example, less than about 585° C. for $Bi_2Te_3$, less than about 706° C. for $Bi_2Se_3$, and less than about 580° C. for $Sb_2Te_3$) to as low as about 100° C.

Materials characterization: Films formed by drop-casting the nanoplates on to glass slides, silicon wafer or TEM grids were characterized by X-ray diffractometry (XRD), scanning and transmission electron microscopy (SEM and TEM) and diffraction, and X-ray photoelectron spectroscopy (XPS). A Brüker D-8 instrument with a Cu Kα (λ=0.154 nm) probe beam was used for XRD. The nanoplate morphology and structure and sintered pellet nanostructure were determined using a field-emission Zeiss Supra 55 SEM operated at 1-5 kV, a Philips CM 12 TEM operated at 120 kV, and a JEOL 2010 TEM operated at 200 kV. Fourier transform infrared (FTIR) spectra were acquired from KBr-compacted pellets with the nanoplates using a Perkin-Elmer Spectrum One spectrometer in the transmittance mode. Wavelength dispersive X-ray spectroscopy was performed on the sintered pellets using a Cameca SX 100 electron microprobe. The sulfur content of the pellet was determined by averaging over 10 to 15 random micron sized regions.

Energy dispersive x-ray spectroscopy (EDS) of the pnictogen chalcogenide nanoplates was carried out during transmission electron microscopy (TEM), as shown in FIG. 2. Semi-quantitative analyses of spectra yields a ratio of Y:Xe (Y:Bi, Sb; Xe:Te, Se) ~40:60, within±3, indicating that the composition is essentially stoichiometric $Bi_2Te_3$ or $Bi_2Se_3$ or $Sb_2Te_3$. The characteristic K x-ray peak from sulfur overlaps with the bismuth M x-ray peak but is conspicuous in the $Sb_2Te_3$ nanoplate X-ray spectrum.

The X-ray diffractograms obtained from films of doped $Bi_2Te_3$, $Bi_2Se_3$ and $Sb_2Te_3$ nanoplates are indexed using the four-index notation referenced to hexagonal axes for the rhombohedral lattice. A few minor peaks are not shown indexed for brevity. All respective peaks can be indexed to the $R\bar{3}m$ crystal structure for all doped $Bi_2Te_3$, $Bi_2Se_3$ and $Sb_2Te_3$ nanoplates. Comparisons were made using standard values JCPDS No. 15-863 for $Bi_2Te_3$, JCPDS No. 33-214 for $Bi_2Se_3$ and JCPDS No. 15-874 for $Sb_2Te_3$. No extraneous peaks are observed, indicating the nanoplates are essentially pure phase, within the detection limit. The calculated lattice parameters ($Bi_2Te_3$: a=b=0.43 nm, c=3.02 nm; $Bi_2Se_3$: a=b=0.41 nm, c=2.86 nm; $Sb_2Te_3$: a=b=0.42 nm, c=3.04 nm) agree with JCPDS values. Fourier transform infrared spectroscopy (FTIR) on KBr pellets with dispersed nanoplates reveals the signature of the thioglycolic acid (TGA). The presence of the sulfur from TGA is indicated by the C—S stretching peak. The absence of the S—H stretching peak is consistent with sulfur bonding to surface bismuth and chalcogen atoms, in agreement with XPS analyses.

Figure 22:
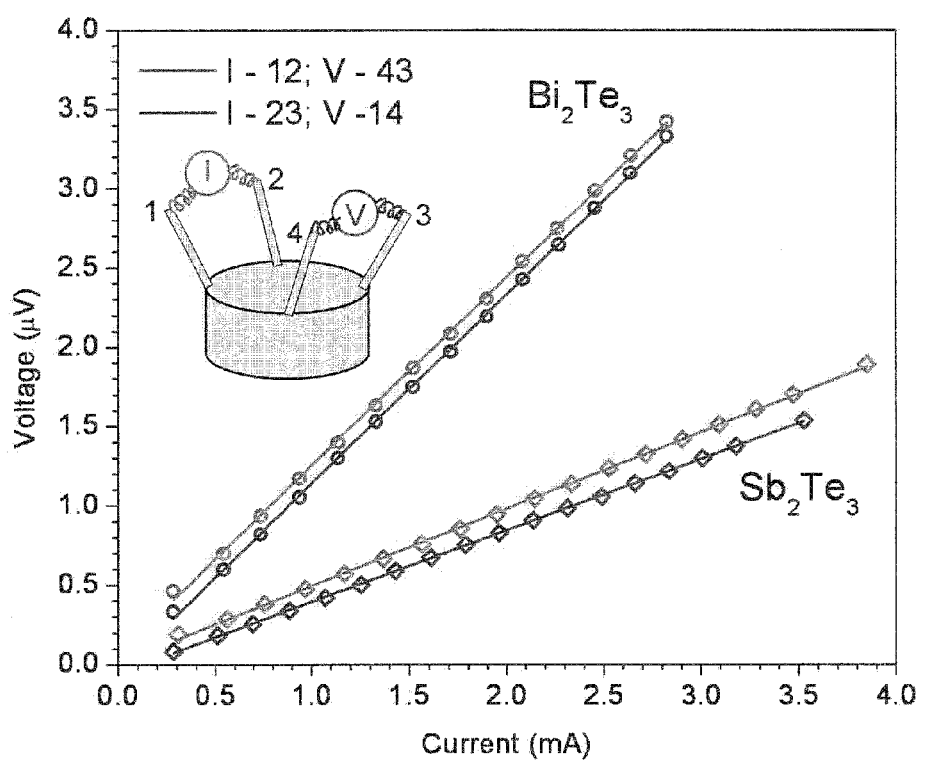
FIG. 22 shows a plot of room temperature AC current-voltage characteristics for two configurations of the Van der Pauw geometry for pellets of bulk assemblies of $Bi_2Te_3$ (○) and $Sb_2Te_3$ (◇) nanoplates.

Thermoelectric transport characterization: Electrical conductivities of the pellets were measured by an AC four-probe switching method with Van der Pauw geometry and a lock-in amplifier using 6000 Hz AC current, as shown in FIG. 22, while the Seebeck coefficient and the thermal conductivity were measured by a steady-state setup. The pellet's thermal resistance and Seebeck voltage were determined by inserting the sample between two indium layers with embedded E-type thermocouple and a thin copper wire. Indium minimizes the contact resistance and spreads the heat flux across the sample and the copper wires were used for measuring the Seebeck voltage. The lower indium piece contacted the heat sink while the upper piece contacted a heater. A thick Teflon block was placed above the heater and gently fastened to the system to minimize heat loss and measurements were conducted in vacuum. The uncertainty in the electrical conductivity, Seebeck coefficient and thermal conductivity are about 2, 2, and 5 percent respectively.

For the I-V characteristics and Seebeck coefficient measurements, as plotted in FIGS. 21 and 22, two independent techniques were used to characterize the thermoelectric properties of the nanoplate films. A fabricated electrical circuit was used for film electrical conductivity and Seebeck coefficient measurements. The electrical circuits, as shown in the insert of FIG. 21, were made by patterning using photolithography and subsequent gold deposition on glass slides. Films were formed by dip-coating or drop-casting the nanoplates from suspensions in ethanol, acetone, or 2-propanol. Electrical conductivity was measured using a four-probe technique. For the Seebeck measurements, a combination of a gold thin film heater and thermistors were used for temperature measurements. The thermistors were calibrated immediately prior to use. A temperature gradient was established in the substrate and the nanoplate film by passing current through the free-standing heater with the other end attached to a heat sink. An AFM based hot probe technique was used on the films for measuring thermal conductivity and Seebeck coefficients. Electrical conductivities of the pellets were measured by an AC four-probe switching method, while the Seebeck coefficient and the thermal conductivity were measured using a steady-state setup. The uncertainty in the electrical conductivity, Seebeck coefficient, and thermal conductivity are ~2, 2, and 5 percent, respectively.

All patents, patent applications, provisional applications, and publications referred to or cited herein are incorporated by reference in their entirety, including all figures and tables, to the extent they are not inconsistent with the explicit teachings of this specification.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment.

It should be understood that the examples and embodiments described herein are for illustrative purposes only and that various modifications or changes in light thereof will be suggested to persons skilled in the art and are to be included within the spirit and purview of this application. In addition, any elements or limitations of any invention or embodiment thereof disclosed herein can be combined with any and/or all other elements or limitations (individually or in any combination) or any other invention or embodiment thereof disclosed herein, and all such combinations are contemplated with the scope of the invention without limitation thereto.

What is claimed is:

1. A doped pnictogen chalcogenide nanoplate comprising a rhombohedral crystal of $Bi_2Te_3$, $Bi_2Se_3$, or $Sb_2Te_3$ that is sulfur doped with less than 10 atom percent, wherein the doped pnictogen chalcogenide nanoplates are hexagonal in shape.

2. The nanoplate of claim 1, wherein the sulfur dopant level is less than 1%.

3. The nanoplate of claim 1, wherein the nanoplate is surface ligated by a mercaptan terminated ligand.

4. The nanoplate of claim 3, wherein the surface ligation by the mercaptan terminated ligand provides a capping layer for oxidation protection.

5. The nanoplate of claim 1, wherein the mercaptan terminated ligand is thioglycolic acid (TGA).

6. The nanoplate of claim 1, wherein the nanoplate displays bounding edge dimensions of 10 nm to 1,200 nm and thickness of 5 nm to 20 nm.

7. The nanoplate of claim 1, wherein the pnictogen chalcogenide has a pnictogen to chalcogenide stoichiometry that ranges from 5 atom percent pnictogen rich to 5 atom percent chalcogenide rich.

8. The nanoplate of claim 1, wherein the pnictogen chalcogenide is a bismuth chalcogenide and has a negative Seebeck coefficient.

9. The nanoplate of claim 1, wherein the pnictogen chalcogenide is an antimony telluride and has a positive Seebeck coefficient.

10. A thermoelectric device comprising doped pnictogen chalcogenide nanoplates of claim 1, wherein the doped pnictogen chalcogenide nanoplates are in the form of a bulk assembly or a fused film.

11. A method of preparing the doped pnictogen chalcogenide nanoplates of claim 1, comprising:
    providing a thiocarboxylic acid ligated pnictogen;
    providing a phosphine ligated chalcogen;
    combining the thiocarboxylic acid ligated pnictogen and phosphine ligated chalcogen in an alkane diol or polyol solvent to form a reaction mixture; and
    irradiating the reaction mixture with microwaves, whereby a precipitate of the doped pnictogen chalcogenide nanoplates forms.

12. The method of claim 11, wherein the thiocarboxylic acid is thioglycolic acid.

13. The method of claim 11, wherein the phosphine is trioctylphosphine (TOP).

14. The method of claim 11, wherein the alkane diol is pentanediol.

15. The method of claim 11, wherein microwave radiation is provided by a microwave oven.

16. A bulk assembly of the doped pnictogen chalcogenide nanoplates of claim 1, comprising a multiplicity of the doped pnictogen chalcogenide nanoplates,
    wherein the assembly has greater than 95 percent of the density of the equivalent bulk pnictogen chalcogenide.

17. The assembly of claim 16, wherein the assembly has a thermal conductivity ($\kappa$) of 0.5 to 1.4 W/mK.

18. A method of preparing a bulk assembly of the doped pnictogen chalcogenide nanoplates of claim 1, comprising:
    providing dry doped pnictogen chalcogenide nanoplates;
    compacting the dry doped pnictogen chalcogenide nanoplates under pressure; and
    sintering the compacted doped pnictogen chalcogenide nanoplates.

19. The assembly of claim 16, wherein the assembly has a Seebeck coefficient ($\alpha$) of $-300$ to $-60$ $\mu$V/K for $Bi_2Te_3$, $-250$ to $-40$ $\mu$V/K for $Bi_2Se_3$, and 90 to 200 $\mu$V/K for $Sb_2Te_3$.

20. The assembly of claim 16, wherein the assembly has a Seebeck coefficient ($\alpha$) of $-220$ to $-90$ $\mu$V/K for $Bi_2Te_3$, $-80$ to $-40$ $\mu$V/K for $Bi_2Se_3$, or 105 to 135 $\mu$V/K for $Sb_2Te_3$.

21. The assembly of claim 17, wherein the assembly has an electrical conductivity ($\sigma$) of 0.3 to $2.5 \times 10^5$ $\Omega^{-1}m^{-1}$.

22. The method of claim 18, wherein the sintering of the compacted doped pnictogen chalcogenide nanoplates is performed under vacuum at a temperature of at least 100° C. to a maximum temperature of less than a melting point of the pnictogen chalcogenide.

23. A fused film of the doped pnictogen chalcogenide nanoplates of claim 1, comprising a multiplicity of doped pnictogen chalcogenide nanoplates.

24. The fused film of claim 23, wherein the pnictogen chalcogenide is $Bi_2Te_3$ having a thermal conductivity ($\kappa$) of about 0.35 $Wm^{-1}K^{-1}$ or $Bi_2Se_3$ having a thermal conductivity ($\kappa$) of about 0.52 $Wm^{-1}K^{-1}$.

25. The fused film of claim 23, wherein the pnictogen chalcogenide is $Bi_2Te_3$ having a Seebeck coefficient ($\alpha$) of $-100$ to $-300$ $\mu$V/K or $Bi_2Se_3$ having a Seebeck coefficient ($\alpha$) of about 1 to 250 $\mu$V/K.

26. The fused film of claim 23, wherein the multiplicity of doped pnictogen chalcogenide nanoplates are deposited into the fused film by inkjet printing, drop-casting, or dip-coating of the doped pnictogen chalcogenide nanoplates.

* * * * *

UNITED STATES PATENT AND TRADEMARK OFFICE
CERTIFICATE OF CORRECTION

PATENT NO. : 8,524,362 B2  
APPLICATION NO. : 12/856264  
DATED : September 3, 2013  
INVENTOR(S) : Ramanath et al.

Page 1 of 1

It is certified that error appears in the above-identified patent and that said Letters Patent is hereby corrected as shown below:

In the Specification

Column 2,  
Line 1, "calcogenide" should read --chalcogenide--.  
Line 10, "calcogenide" should read --chalcogenide--.

Column 5,  
Lines 60-61, "susceptor" should read --susceptors--.

Column 8,  
Line 26, "FIGS. 13a) and h)," should read --FIG. 13 a) and b),--.  
Line 57, "of a shown" should read --of α shown--.

Column 9,  
Line 34, "x axis" should read --κ axis--.  
Line 37, "chaicogenides" should read --chalcogenides--.

Column 10,  
Line 13, "K values" should read --κ values--.  
Line 61, "the hulk" should read --the bulk--.

Signed and Sealed this  
Third Day of June, 2014

Michelle K. Lee  
*Deputy Director of the United States Patent and Trademark Office*